(12) United States Patent
Nagamine et al.

(10) Patent No.: US 8,143,684 B2
(45) Date of Patent: Mar. 27, 2012

(54) MAGNETORESISTIVE ELEMENT

(75) Inventors: Makoto Nagamine, Komae (JP);
Toshihiko Nagase, Sagamihara (JP);
Sumio Ikegawa, Musashino (JP);
Katsuya Nishiyama, Yokohama (JP);
Masatoshi Yoshikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/013,141

(22) Filed: Jan. 25, 2011

(65) Prior Publication Data

US 2011/0116305 A1 May 19, 2011

Related U.S. Application Data

(60) Division of application No. 12/470,786, filed on May 22, 2009, now Pat. No. 7,898,846, which is a continuation of application No. 11/384,566, filed on Mar. 21, 2006, now abandoned.

(30) Foreign Application Priority Data

Jun. 23, 2005 (JP) .................................. 2005-183718

(51) Int. Cl.
*G11C 11/00* (2006.01)
*H01L 29/82* (2006.01)

(52) U.S. Cl. ...................................................... 257/427

(58) Field of Classification Search .............. 257/68–71, 257/295–309, 905–908, E27.084–E27.097, 257/E27.075, E43.001–E43.007, E27.005–E27.006, 257/E27.008, E27.164, E29.167, E29.272, 257/E29.323, E27.104; 438/3, 785; 365/158, 365/171, 173, 55

See application file for complete search history.

(56) References Cited

U.S. PATENT DOCUMENTS

| 2005/0008849 | A1* | 1/2005 | Kagami et al. | 428/328 |
| 2005/0276099 | A1* | 12/2005 | Horng et al. | 365/158 |
| 2007/0047159 | A1* | 3/2007 | Zhao et al. | 360/324.12 |

FOREIGN PATENT DOCUMENTS

| JP | 10-261209 | 9/1998 |
| JP | 2001-331908 | 11/2001 |
| JP | 2002-50011 | 2/2002 |
| JP | 2002-208119 | 7/2002 |
| JP | 2003-318462 | 11/2003 |
| JP | 2004-172599 | 6/2004 |
| JP | 2005-32780 | 2/2005 |
| JP | 2005-72608 | 3/2005 |

* cited by examiner

*Primary Examiner* — Dao H Nguyen
*Assistant Examiner* — Tram H Nguyen
(74) *Attorney, Agent, or Firm* — Oblon, Spivak, McClelland, Maier & Neustadt, L.L.P.

(57) ABSTRACT

A magnetoresistive element includes a first magnetic layer which includes a first surface and a second surface and has a first standard electrode potential, a second magnetic layer, a barrier layer which is provided between the second magnetic layer and the first surface of the first magnetic layer, and a nonmagnetic cap layer which contacts the second surface of the first magnetic layer and is formed from an alloy of a first metal material and a second metal material, the first metal material having a second standard electrode potential lower than the first standard electrode potential, the second metal material having a third standard electrode potential higher than the first standard electrode potential.

5 Claims, 19 Drawing Sheets

FIG. 2

| No | Metal | Standard electrode potential (V) | Reaction formula |
|---|---|---|---|
| 1 | Sr | -4.1, -2.89 | Sr++e=Sr, Sr2++2e=Sr |
| 2 | Ca | -3.80, -2.868 | Ca++e=Ca, Ca2++2e=Ca |
| 3 | Ba | -2.912 | Ba2++2e=Ba |
| 4 | Eu | -2.812, -1.991 | Eu2++2e=Eu, Eu3++3e=Eu |
| 5 | Yb | -2.76, -2.19 | Yb2++2e=Yb, Yb3++3e=Yb |
| 6 | Mg | -2.70, -2.372 | Mg++e=Mg, Mg2++2e=Mg |
| 7 | Sm | -2.68, -2.304 | Sm2++ 2e=Sm, Sm3++3e=Sm |
| 8 | Tm | -2.4, -2.319 | Tm2++2e=Tm, Tm3++3e=Tm |
| 9 | La | -2.379 | La3++3e=La |
| 10 | Y | -2.372 | Y3++3e=Y |
| 11 | Pr | -2.353, -2.0 | Pr3++3e=Pr, Pr2++2e=Pr |
| 12 | Ce | -2.336 | Ce3++3e=Ce |
| 13 | Er | -2.331, -2.0 | Er3++3e=Er, Er2++2e=Er |
| 14 | Ho | -2.33, -2.1 | Ho3++3e=Ho, Ho2++2e=Ho |
| 15 | Nd | -2.323 | Nd3++3e=Nd |
| 16 | Dy | -2.295, -2.2 | Dy3++3e=Dy, Dy2++2e=Dy |
| 17 | Lu | -2.28 | Lu3++3e=Lu |
| 18 | Tb | -2.28 | Tb3++3e=Tb |
| 19 | Gd | -2.279 | Gd3++3e=Gd |
| 20 | Nd | -2.1 | Nd2++2e=Nd |

| No | Metal | Standard electrode potential (V) | Reaction formula |
|---|---|---|---|
| 21 | Sc | -2.077 | Sc3++3e=Sc |
| 22 | Th | -1.899 | Th4++4e=Th |
| 23 | Be | -1.847 | Be2++2e=Be |
| 24 | Al | -1.662 | Al3++3e=Al |
| 25 | Ti | -1.63, -1.37 | Ti2++2e=Ti, Ti3++3e=Ti |
| 26 | Hf | -1.55 | Hf4++4e=Hf |
| 27 | Zr | -1.45 | Zr4++4e=Zr |
| 28 | Mn | -1.185 | Mn2++2e=Mn |
| 29 | V | -1.175 | V2++2e=V |
| 30 | Nb | -1.099 | Nb3++3e=Nb |
| 31 | Cr | -0.913, -0.744 | Cr2++2e=Cr, Cr3++3e=Cr |
| 32 | Zn | -0.7618 | Zn2++2e=Zn |
| 33 | Ta | -0.6 | Ta3++3e=Ta |
| 34 | Fe | -0.447, -0.037 | Fe2++2e=Fe, Fe3++3e=Fe |
| 35 | Cd | -0.403 | Cd2++2e=Cd |
| 36 | In | -0.3382, -0.14 | In3++3e=In, In++e=In |
| 37 | Tl | -0.336, -0.741 | Tl++e=Tl, Tl3++3e=Tl |
| 38 | Co | -0.28 | Co2++2e=Co |
| 39 | Ni | -0.257 | Ni2++2e=Ni |
| 40 | Mo | -0.200 | Mo3++3e=Mo |

| No | Metal | Standard electrode potential (V) | Reaction formula |
|---|---|---|---|
| 41 | Sn | -0.1375 | Sn2++2e=Sn |
| 42 | Pb | -0.1262 | Pb2++2e=Pb |
| 43 | W | 0.1 | W3++3e=W |
| 44 | Re | 0.300 | Re3++3e=Re |
| 45 | Cu | 0.3419, 0.521 | Cu2++2e=Cu, Cu++e=Cu |
| 46 | Ru | 0.455 | Ru2++2e=Ru |
| 47 | Rh | 0.600, 0.758 | Rh(2,1)++(2,1)e=Rh, Rh3++3e=Rh |
| 48 | Ag | 0.7996 | Ag++e=Ag |
| 49 | Os | 0.838 | OsO4+8H+ + 8e =Os +4H2O |
| 50 | Pd | 0.951 | Pd2++2e=Pd |
| 51 | Ir | 1.156 | Ir3++3e=Ir |
| 52 | Pt | 1.18 | Pt2++2e=Pt |
| 53 | Au | 1.498, 1.692 | Au3++3e=Au, Au++e=Au |

Ref: "CRC Handbook of Chemistry and Physics", 83rd ed., CRC Press (2002)

Except low-melting metals (alkali metal, etc.), nonmetallic elements, and unstable radioactive elements

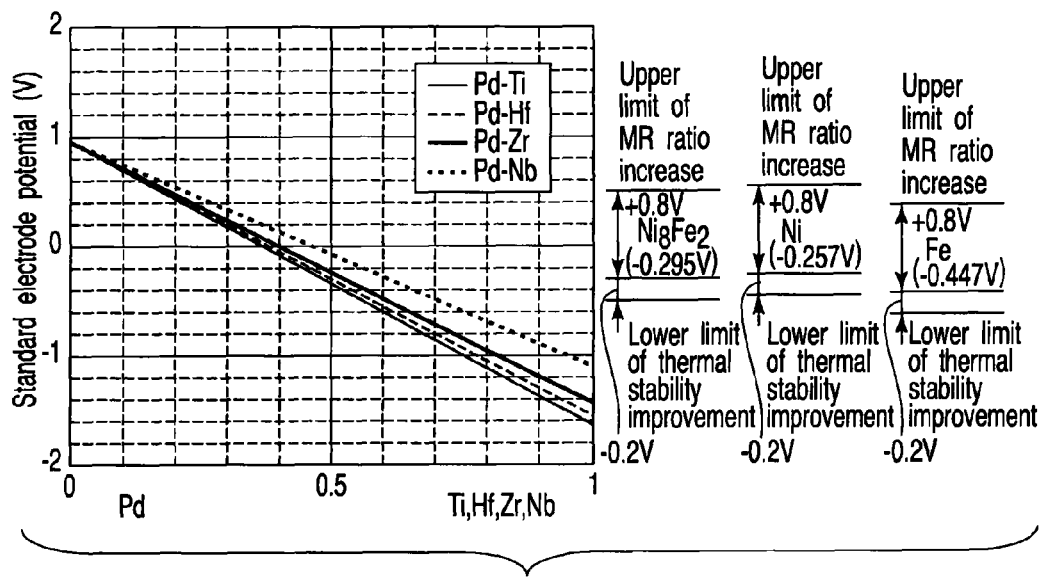
F I G. 1 2
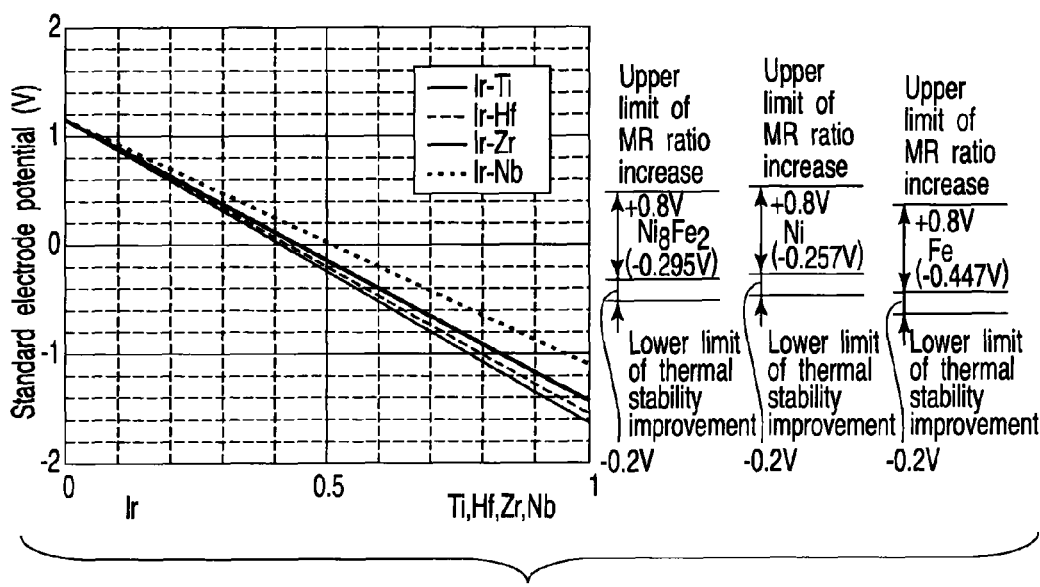
F I G. 1 3

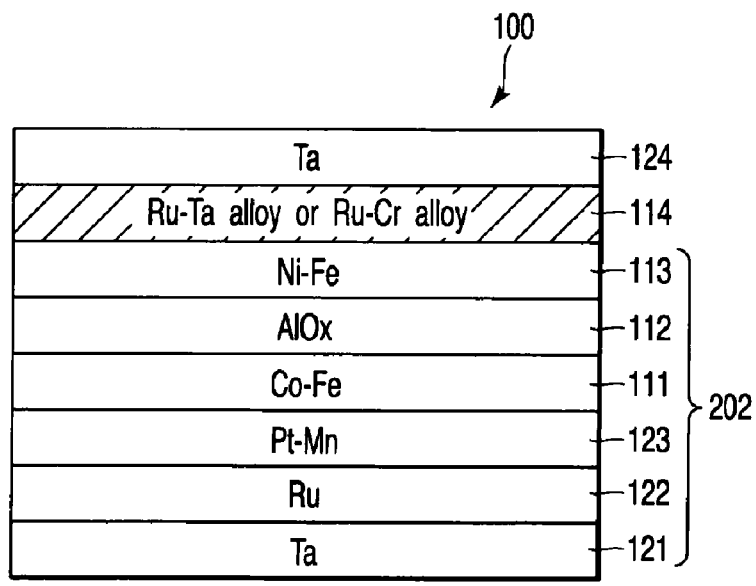
F I G. 1 6
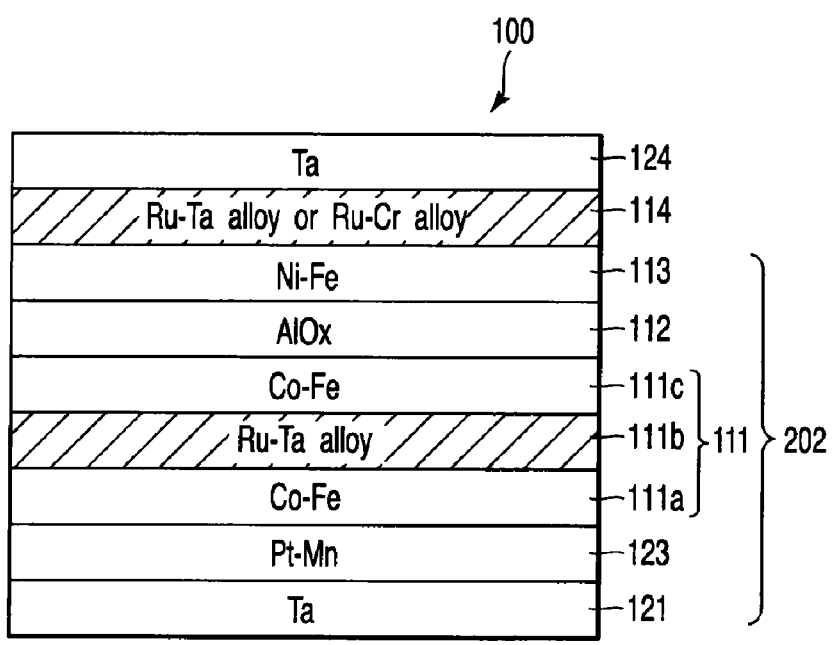
F I G. 1 7

MAGNETORESISTIVE ELEMENT

CROSS-REFERENCE TO RELATED APPLICATIONS

This application is a divisional of U.S. application Ser. No. 12/470,786, filed May 22, 2009, which is a continuation application of U.S. application Ser. No. 11/384,566, filed Mar. 21, 2006, which claims priority to Japanese Patent Application No. 2005-183718, filed Jun. 23, 2005, the entire contents of which are incorporated herein by reference.

BACKGROUND OF THE INVENTION

1. Field of the Invention

The present invention relates to a magnetoresistive element having an alloy cap layer and a magnetic random access memory (magnetoresistive random access memory) (MRAM).

2. Description of the Related Art

A magnetic random access memory (MRAM) is a memory device which uses magnetic elements having a magnetoresistance effect as cell units to store information. Magnetic random access memories have received a great deal of attention as next-generation memory devices featuring high-speed operation, large capacity, and nonvolatility. The magnetoresistance effect is a phenomenon that when a magnetic field is applied to a ferromagnetic material, the electrical resistance changes in accordance with the magnetization direction in the ferromagnetic material. A magnetic random access memory can be operated as a memory device (MRAM) by recording information by using such a magnetization direction in a ferromagnetic material and reading out the information on the basis of the magnitude of electrical resistance corresponding to the information.

In recent years, in a ferromagnetic tunnel junction including a sandwich structure having an insulating layer (tunnel barrier layer: to be referred to as a barrier layer hereinafter) inserted between two ferromagnetic layers, a magnetoresistive ratio (MR ratio) of 20% or more can be obtained by a tunnel magneto-resistance (TMR) effect. With this as a momentum, magnetic random access memories which use magnetic tunnel junction (MTJ) elements using the tunnel magneto-resistance effect have been receiving expectation and attention.

When an MTJ element is used in a magnetic random access memory, one of two ferromagnetic layers sandwiching a barrier layer is formed as a magnetization reference layer by using a magnetization pinned layer in which the magnetization direction is fixed and does not change. The other ferromagnetic layer is formed as a free layer by using a magnetization free layer in which the magnetization direction readily reverses. When a state wherein the magnetization direction in the reference layer and that in the free layer are parallel and a state wherein the magnetization directions are anti-parallel are made to correspond to binary numbers of "0" and "1", respectively, information can be stored. When the magnetizations are parallel, the resistance of the barrier layer is low, and the tunnel current is large, as compared to the anti-parallel state. Recording information is written by reversing the magnetization direction in the free layer by an induced magnetization which is generated when a current flows to a write interconnection provided near the MTJ element. Recorded information is read out by detecting a change in resistance by the TMR effect. Hence, the free layer preferably has a high resistance change ratio (MR ratio) by the TMR effect.

When the free layer is located above the magnetization pinned layer, a cap layer is often formed between the free layer and an upper interconnection layer or an etching mask. The upper interconnection layer or etching mask sometimes also serves as the cap layer. The main role of the cap layer is to prevent any degradation in magnetization of the free layer, which would be caused by element diffusion from the upper layer in the heating process or process damage in the upper interconnection layer formation process. In addition, increasing the thermal stability by preventing element diffusion from the cap layer itself to the free layer, and preventing any decrease in MR ratio by interaction with the free layer are necessary. However, no method of satisfying both of them has been reported yet.

As described above, in the cap layer of the MTJ element used in the conventional magnetic random access memory, improvement of the thermal stability by preventing element diffusion from the cap layer to the magnetic layer and prevention of any decrease in MR ratio caused by abnormal oxidation of the free layer are not implemented simultaneously.

References of prior arts related to the present invention are Jpn. Pat. Appln. KOKAI Publication No. 2005-032780, U.S. Patent Application Publication No. 2005/0008849, and Jpn. Pat. Appln. KOKAI Publication Nos. 2002-208119, 2002-050011, 2001-331908, and 2004-172599.

BRIEF SUMMARY OF THE INVENTION

According to a first aspect of the present invention, there is provided a magnetoresistive element comprising a first magnetic layer which includes a first surface and a second surface and has a first standard electrode potential, a second magnetic layer, a barrier layer which is provided between the second magnetic layer and the first surface of the first magnetic layer, and a nonmagnetic cap layer which contacts the second surface of the first magnetic layer and is formed from an alloy of a first metal material and a second metal material, the first metal material having a second standard electrode potential lower than the first standard electrode potential, the second metal material having a third standard electrode potential higher than the first standard electrode potential.

According to a second aspect of the present invention, there is provided a magnetoresistive element comprising a first magnetic layer which includes a first surface and a second surface and has a first standard electrode potential, a second magnetic layer, a barrier layer which is provided between the second magnetic layer and the first surface of the first magnetic layer, a nonmagnetic cap layer which is arranged on a side of the second surface of the first magnetic layer and is formed from an alloy of a first metal material and a second metal material, the first metal material having a second standard electrode potential lower than the first standard electrode potential, the second metal material having a third standard electrode potential higher than the first standard electrode potential, and a diffusion suppressing layer which suppresses diffusion from the nonmagnetic cap layer to the first magnetic layer and is provided between the nonmagnetic cap layer and the first magnetic layer, the diffusion suppressing layer containing one of a metal oxide, a metal nitride, and a metal oxynitride.

According to a third aspect of the present invention, there is provided a magnetoresistive element comprising a first magnetic layer which includes a first surface and a second surface and has a first standard electrode potential, a second magnetic layer, a barrier layer which is provided between the second magnetic layer and the first surface of the first magnetic layer, and a nonmagnetic cap layer which contacts the second surface of the first magnetic layer and is formed from an alloy of a magnetic material and a metal material, the metal material having a second standard electrode potential lower than the first standard electrode potential.

According to a fourth aspect of the present invention, there is provided a magnetoresistive element comprising a first magnetic layer which includes a first surface and a second surface and has a first standard electrode potential, a second magnetic layer, a barrier layer which is provided between the second magnetic layer and the first surface of the first magnetic layer, a nonmagnetic cap layer which is arranged on a side of the second surface of the first magnetic layer and is formed from an alloy of a magnetic material and a metal material, the metal material having a second standard electrode potential lower than the first standard electrode potential, and a diffusion suppressing layer which suppresses diffusion from the nonmagnetic cap layer to the first magnetic layer and is provided between the nonmagnetic cap layer and the first magnetic layer, the diffusion suppressing layer containing one of a metal oxide, a metal nitride, and a metal oxynitride.

According to a fifth aspect of the present invention, there is provided a magnetic random access memory comprising a magnetoresistive element of any one of the first to fourth aspects as a memory element.

BRIEF DESCRIPTION OF THE SEVERAL VIEWS OF THE DRAWING

FIG. 2 is a table showing the standard electrode potentials and reaction formulas of various metal elements;

FIG. 12 is a graph showing the relationship between the metal composition ratio and the standard electrode potential of an alloy cap layer made of Pd—Ti, Pd—Hf, Pd—Zr, or Pd—Nb according to the first embodiment of the present invention;

FIG. 13 is a graph showing the relationship between the metal composition ratio and the standard electrode potential of an alloy cap layer made of Ir—Ti, Ir—Hf, Ir—Zr, or Ir—Nb according to the first embodiment of the present invention;

FIG. 16 is a sectional view showing an MTJ element according to Example 1 of the present invention;

FIG. 17 is a sectional view showing an MTJ element according to Example 2 of the present invention;

FIGS. 23A and 23B are views showing select transistor memory cells of a magnetic random access memory according to an embodiment of the present invention, in which FIG. 23A is a circuit diagram showing a memory cell array, and FIG. 23B is a sectional view showing one cell;

FIGS. 24A and 24B are views showing select diode memory cells of a magnetic random access memory according to an embodiment of the present invention, in which FIG. 24A is a circuit diagram showing a memory cell array, and FIG. 24B is a sectional view showing one cell;

FIGS. 25A and 25B are views showing cross-point memory cells of a magnetic random access memory according to an embodiment of the present invention, in which FIG. 25A is a circuit diagram showing a memory cell array, and FIG. 25B is a sectional view showing one cell.

DETAILED DESCRIPTION OF THE INVENTION

The present inventors made the following examinations to simultaneously improve thermal stability and MR ratio in a magnetic tunnel junction (MTJ) element to be used as a memory element of a magnetic random access memory (MRAM).

Figure 1A:
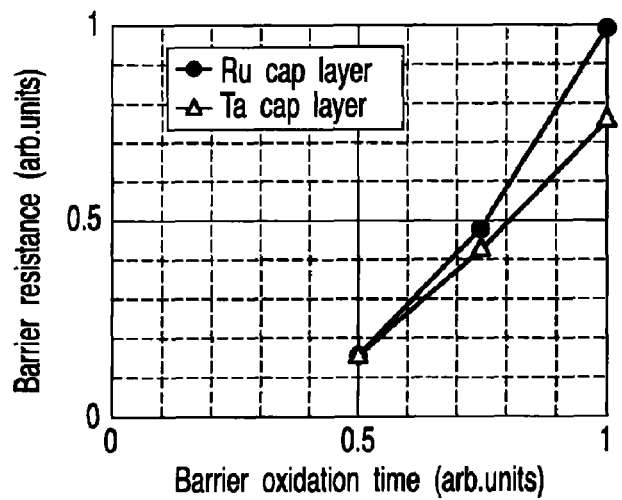
FIG. 1A is a graph showing comparison of the barrier oxidation time dependence of the barrier resistance of an MTJ element between an Ru cap layer and a Ta cap layer.
Figure 1B:
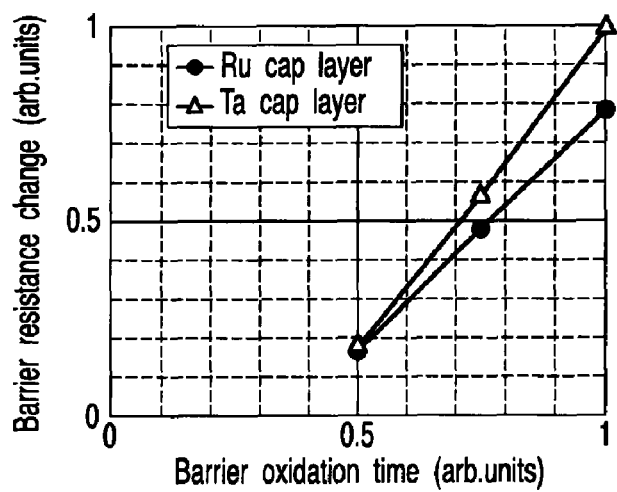
FIG. 1B is a graph showing comparison of the barrier oxidation time dependence of the barrier resistance change of an MTJ element between an Ru cap layer and a Ta cap layer.
Figure 1C:
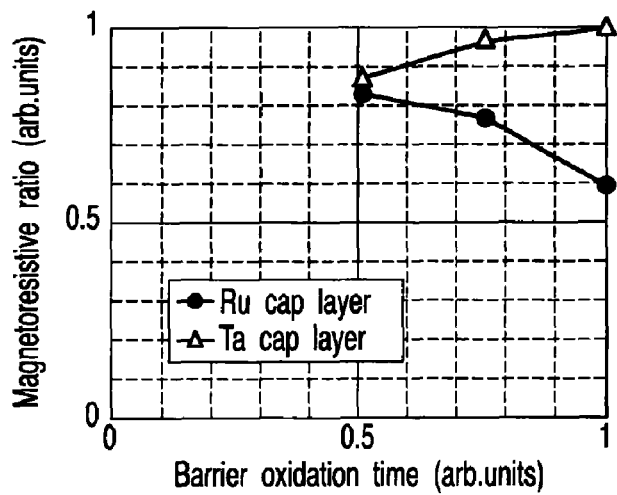
FIG. 1C is a graph showing comparison of the barrier oxidation time dependence of the magnetoresistive ratio (MR ratio) of an MTJ element between an Ru cap layer and a Ta cap layer.

FIGS. 1A to 1C are graphs showing comparison of the barrier oxidation time dependence of the barrier resistance, barrier resistance change, and magnetoresistive ratio (MR ratio) of an MTJ element between an Ru cap layer and a Ta cap layer. The Ru cap layer or Ta cap layer is provided adjacent to one of the two ferromagnetic layers sandwiching the tunnel barrier layer of an MTJ element.

As is apparent from FIG. 5 (to be described later), even after annealing at 350° C., the Ru cap layer maintains magnetization of 90% or more that before annealing. However, in the Ta cap layer, the magnetization decreases to 80% or less after annealing. When the Ru cap layer is used, element diffusion from the cap layer to the ferromagnetic layer is low as compared to the Ta cap layer. That is, the Ru cap layer has a higher thermal stability than the Ta cap layer.

However, as shown in FIGS. 1A to 1C, when the Ru cap layer is used, the barrier resistance of the MTJ element is high, and the barrier resistance change and the maximum value of the magnetoresistive ratio (MR ratio) are small as compared with the Ta cap layer.

Hence, a high thermal stability by low diffusion and a high MR ratio can hardly be implemented simultaneously by the Ru cap layer which places emphasis on only preventing element diffusion or the Ta cap layer which places emphasis on only preventing the decrease in MR ratio.

As a reason for the difference in MTJ characteristic between the Ru cap layer and the Ta cap layer, the difference in standard electrode potential of the cap layer to an adjacent ferromagnetic layer will be examined.

Figure 3A:
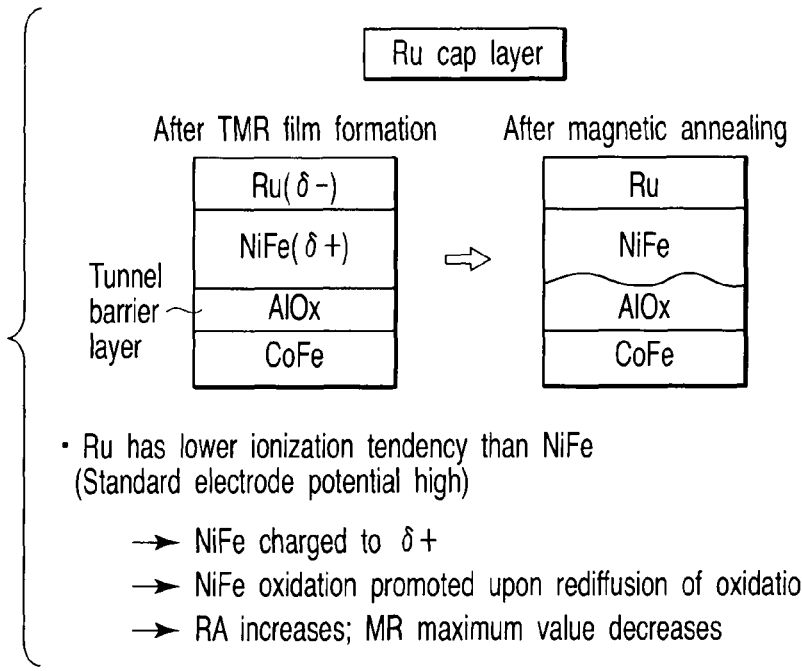
FIGS. 3A and 3B are views showing models so as to explain the difference in barrier resistance and magnetoresistive ratio between cap layers.
Figure 3B:
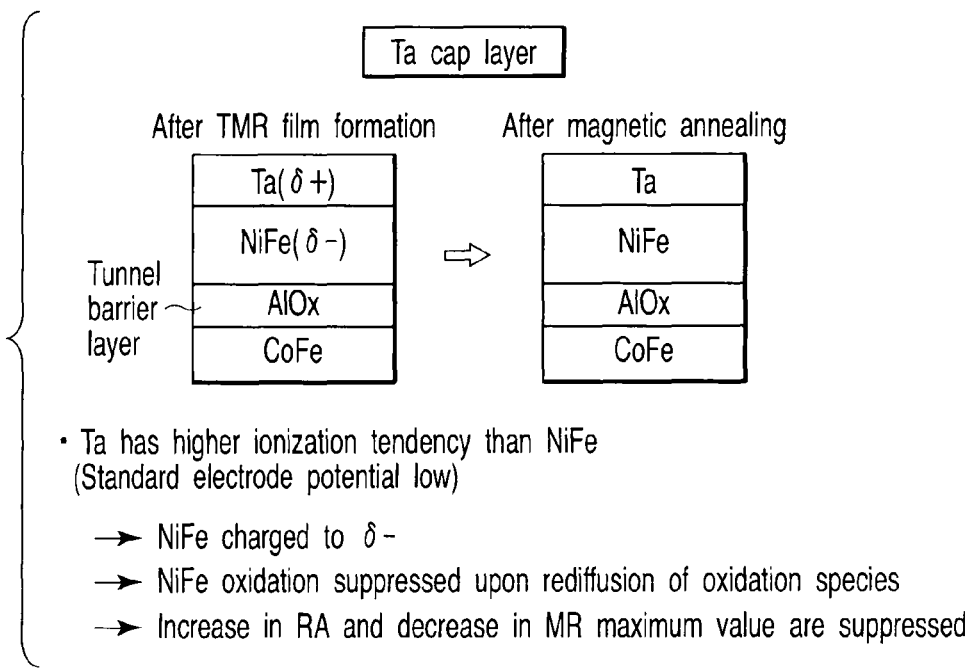

FIG. 2 shows the standard electrode potentials and reaction formulas of various metal elements. FIGS. 3A and 3B are views showing models so as to explain the difference in barrier resistance and magnetoresistive ratio between cap layers. Referring to FIG. 2, in metal elements (e.g., Ti, Fe, and the like) having two standard electrode potentials, the standard electrode potential on the upper side is preferably used.

FIG. 2 indicates that as the standard electrode potential is close to the (+) side, the Coulomb repulsion for metal ions to dissolve in an aqueous solution is necessary, and ionization hardly occurs.

Consider a case wherein the free layer adjacent to the Ru cap layer or Ta cap layer is made of NiFe. In this case, the standard electrode potentials of the materials of the cap layer and free layer are Ta (No. 33), Fe (No. 34), Ni (No. 39), and Ru (No. 46) sequentially from the (−) side, as shown in FIG. 2. The ionization tendency increases in the order of Ta, Ni, Fe, and Ru in accordance with the order of standard electrode potentials. On the basis of the order of ionization tendencies, an explanation can be done as shown in FIGS. 3A and 3B.

As shown in FIG. 3A, in the Ru cap layer, NiFe is ionized more readily than Ru and charged to δ+. For this reason, in magnetic annealing after tunneling magneto resistive (TMR) film formation, abnormal oxidation of NiFe (the valence of the metal becomes positive) is promoted by rediffusion of the oxidation species from the tunnel barrier layer. Hence, the barrier resistance abnormally rises. The abnormal oxidation of NiFe also causes a decrease in steepness of the interface between the NiFe layer and the tunnel barrier layer. Hence, the barrier resistance change and the maximum value of the MR ratio decrease.

On the other hand, as shown in FIG. 3B, in the Ta cap layer, Ta is ionized more readily than NiFe, and NiFe is charged to δ−. For this reason, abnormal oxidation of NiFe by rediffusion of the oxidation species from the tunnel barrier layer is suppressed. Hence, the increase in barrier resistance, the decrease in barrier resistance change, and the decrease in maximum value of the MR ratio are prevented.

As described above, the low diffusion/high thermal stability and the high MR ratio cannot be implemented simultaneously by the Ru cap layer which places emphasis on preventing element diffusion from the cap layer to the ferromagnetic layer or the Ta cap layer which places emphasis on preventing the decrease in MR ratio by preventing abnormal oxidation of the free layer.

Jpn. Pat. Appln. KOKAI Publication No. 2005-032780 and U.S. Pre-Grant Publication No. 2005/0008849 disclose a method of preventing oxidation of a free layer, in which a cap layer adjacent to the free layer of a magnetoresistive element is formed by using a material containing an element having a high bond energy to O (oxygen). However, neither types nor concentrations of elements to be combined with the element having the high bond energy to O are disclosed. When an element having a high bond energy and a high ionization tendency is used, a high MR ratio can be implemented. However, low diffusion/high thermal stability cannot be expected unless appropriate elements are combined at an appropriate concentration ratio. Additionally, the bond energy to O is a physical property value which reflects the state of a metal oxide as a product after reaction and is therefore less appropriate as an index to determine the reactivity to O than an ionization tendency (standard electrode potential) which reflects the state of a metal element before reaction.

Jpn. Pat. Appln. KOKAI Publication No. 2002-208119 discloses that the cap layer of a pinned layer of a giant magneto resistive (GMR) head is formed by using at least one of Ta, W, and Ti. However, neither types nor concentrations of elements to be combined with these materials are disclosed. A high MR ratio and low diffusion/high thermal stability cannot be implemented simultaneously unless appropriate elements are combined at an appropriate concentration ratio.

Jpn. Pat. Appln. KOKAI Publication No. 2002-050011 discloses that the upper layer of the pinned layer of a magnetic recording medium is formed by using a mixture of at least two materials selected from the group consisting of Au, Ag, Cu, Mo, W, Y, Ti, Pt, Zr, Hf, V, Nb, Ta, and Ru. However, neither types nor concentrations of elements to be combined are disclosed. A high MR ratio and low diffusion/high thermal stability cannot be implemented simultaneously unless appropriate elements are combined at an appropriate concentration ratio.

Jpn. Pat. Appln. KOKAI Publication No. 2001-331908 discloses that in the slider cutting margin of a thin-film magnetic head, a local cell is formed by a magnetic metal film (NiFe) and a thin film (Cu, Al, Zn, or Fe) having a high ionization tendency, thereby preventing magnetic metal corrosion. In the thin film, the thermal stability is not taken into consideration. Hence, although a high MR ratio can be implemented, low diffusion/high thermal stability cannot be implemented simultaneously unless appropriate elements are combined at an appropriate concentration ratio.

Jpn. Pat. Appln. KOKAI Publication No. 2004-172599 discloses a film structure including a nonmagnetic conductor/anti-diffusion structure/magnetic layer of a magnetoresistive element in which the anti-diffusion structure is made of one of $AlO_x$, $MgO_x$, $SiO_x$, $TiO_x$, $CaO_x$, $LiO_x$, $HfO_x$, AlN, AlNO, SiN, SiNO, TiN, TiNO, BN, TaN, HfNO, and ZrN, and the nonmagnetic conductor contains at least one element selected from Al, Cu, Ta, Ru, Zr, Ti, Mo, and W. However, if the nonmagnetic conductor is readily diffused, diffusion to the magnetic layer progresses through the anti-diffusion structure. In addition, the ionization tendency of the nonmagnetic conductor charges the magnetic layer through the thin anti-diffusion structure and influences the presence/absence of abnormal oxidation of the magnetic layer. Hence, a high MR ratio and low diffusion/high thermal stability cannot be implemented simultaneously unless appropriate elements are combined for the nonmagnetic conductor at an appropriate concentration ratio.

On the basis of the above-described examinations, the embodiments of the present invention will be described below with reference to the accompanying drawing.

[1] Magnetoresistive Element

In the first to third embodiments of the present invention, cases wherein an MTJ element is used as a magnetoresistive element will be described.

[1-1] First Embodiment

Figure 4:
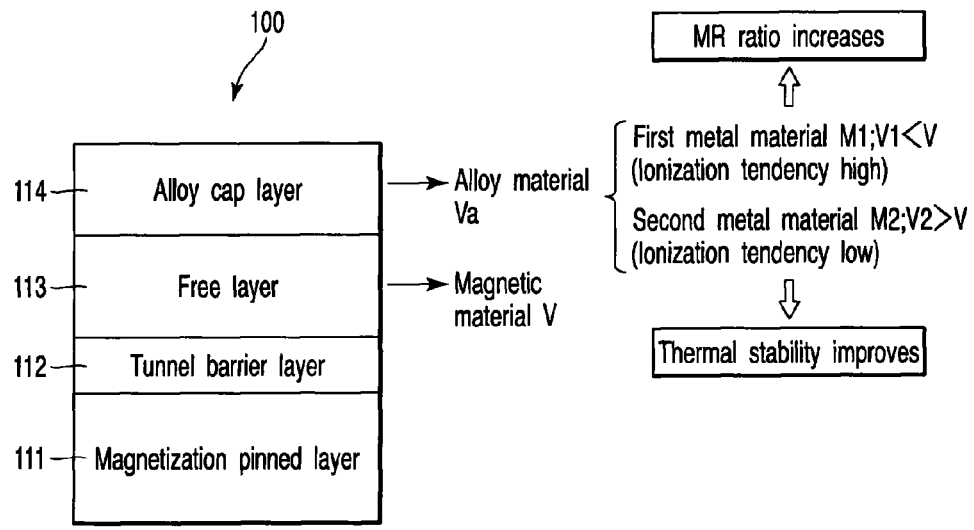
FIG. 4 is a schematic view showing an MTJ element according to the first embodiment of the present invention.

FIG. 4 is a schematic view showing an MTJ element according to the first embodiment of the present invention. The outline of the structure of the MTJ element according to the first embodiment will be described below.

As shown in FIG. 4, an MTJ element 100 according to the first embodiment includes a magnetization pinned layer (magnetic layer) 111 whose magnetization is fixed, a free layer (magnetic layer) 113 whose magnetization reverses, a tunnel barrier layer (nonmagnetic layer) 112 sandwiched between the magnetization pinned layer 111 and the free layer 113, and an alloy cap layer 114 in contact with the free layer 113.

The alloy cap layer 114 is formed of a nonmagnetic layer. The alloy cap layer 114 is made of an alloy of a first metal material M1 and a second metal material M2. A standard electrode potential V1 of the first metal material M1 is lower than a standard electrode potential V of the free layer 113 adjacent to the alloy cap layer 114 (the ionization tendency is high). A standard electrode potential V2 of the second metal material M2 is higher than the standard electrode potential V (the ionization tendency is low).

In the first embodiment, as the first metal material M1 of the alloy cap layer 114, a material having the standard electrode potential V1 lower than the standard electrode potential V of the free layer 113 adjacent to the alloy cap layer 114 (a material having a high ionization tendency) is used, thereby preventing abnormal oxidation of the free layer 113 and increasing the MR ratio. On the other hand, as the second metal material M2 of the alloy cap layer 114, a material having the standard electrode potential V2 higher than the standard electrode potential V of the free layer 113 adjacent to the alloy cap layer 114 (a material having a low ionization tendency) is used, thereby preventing element diffusion from the alloy cap layer 114 to the free layer 113 and improving the thermal stability. That is, in the first embodiment, both a high MR ratio and a high thermal stability are implemented by using an alloy of the first metal material M1 which contributes to improvement of the MR ratio and the second metal material M2 which contributes to improvement of the thermal stability.

The material and standard electrode potential of the alloy cap layer 114 will be described below in detail.

(a) MATERIAL OF ALLOY CAP LAYER

As described above, as the material of the alloy cap layer 114, an alloy containing the first metal material M1 and the second metal material M2 is used. The alloy materials and mixing ratio of the alloy cap layer 114 containing the first and second metal materials M1 and M2 will be described below in detail on the basis of the viewpoint of improving both the thermal stability and the MR ratio.

Figure 5:
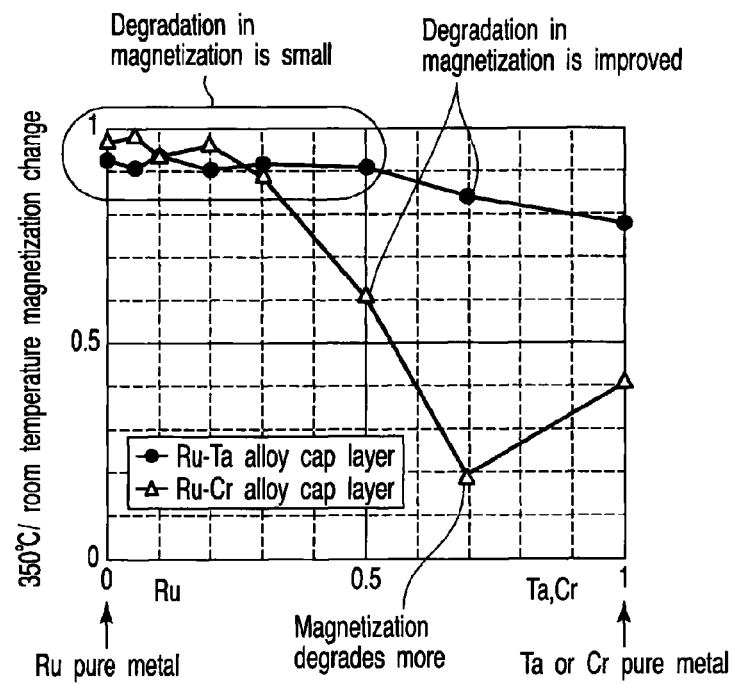
FIG. 5 is a graph showing the Ru—Ta or Ru—Cr composition dependence of the magnetization change in a free layer upon annealing when an Ru—Ta or Ru—Cr alloy cap layer is used as the alloy cap layer according to the first embodiment of the present invention.

FIG. 5 is a graph showing the Ru—Ta or Ru—Cr composition dependence of the magnetization change in the free layer upon annealing when an Ru—Ta or Ru—Cr alloy cap layer is used as the alloy cap layer according to the first embodiment of the present invention. FIG. 5 shows a result obtained by using blanket wafer samples of an Ru—Ta or Ru—Cr alloy cap layer (thickness: 3 nm)/NiFe magnetic layer (thickness: 4 nm)/$AlO_x$ (thickness: 1 nm)/Ta (thickness: 3 nm)/substrate and checking the Ru—Ta or Ru—Cr composition dependence of the magnetization change in the free layer (NiFe magnetic layer) upon annealing at 350° C. by a vibrating sample magnetometer (VSM). The abscissa of FIG. 5 indicates that the mixing ratio of Ru increases leftward so that an Ru pure metal is obtained at the left end, and the mixing ratio of Ta or Cr increases rightward so that a Ta or Cr pure metal is obtained at the right end.

As is apparent from FIG. 5, in the cap layer made of a Ta or Cr pure metal, diffusion of the cap layer material (Ta or Cr) to the free layer progresses upon annealing, and the magnetization change in the free layer decreases. However, when the mixing ratio of Ru with a high ionization tendency to Ta or Cr with a low ionization tendency is increased, diffusion of the cap layer material to the free layer is suppressed by the effect of Ru with low diffusion. Hence, the degradation in magnetization caused by annealing is suppressed.

When the ratio of Ta in the Ru—Ta alloy cap layer is about 0.5 or less, or the ratio of Cr in the Ru—Cr alloy cap layer is about 0.3 or less, the degradation in magnetization caused by annealing is suppressed to almost the same as in an Ru pure metal cap layer, and almost the same thermal stability as in the Ru pure metal cap layer is obtained.

When the ratio of Ta in the Ru—Ta alloy cap layer is 0.7, or the ratio of Cr in the Ru—Cr alloy cap layer is 0.5, the degradation in magnetization progresses more than the case wherein the ratio of Ta or Cr is lower. However, the magnetization change is smaller than in the Ta or Cr pure metal cap layer. Hence, the degradation in magnetization improves as compared to the Ta or Cr pure metal cap layer.

Note that when the ratio of Cr in the Ru—Cr alloy cap layer is 0.7, the magnetization change is larger than in the Cr pure metal cap layer, and the degradation in magnetization is promoted.

Figure 6:
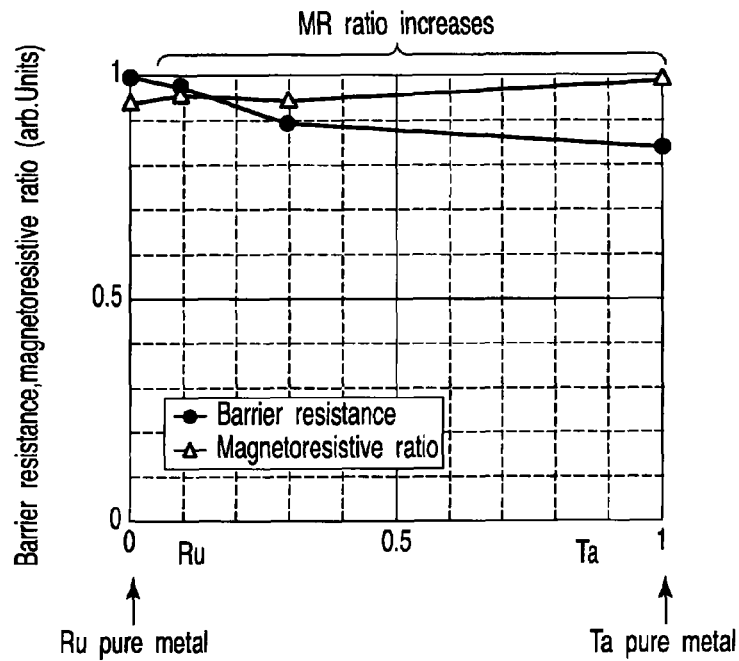
FIG. 6 is a graph showing the Ru—Ta composition dependence of the barrier resistance and magnetoresistive ratio of an MTJ element when an Ru—Ta alloy cap layer is used as the alloy cap layer according to the first embodiment of the present invention.

FIG. 6 is a graph showing the Ru—Ta composition dependence of the barrier resistance and magnetoresistive ratio of an MTJ element when an Ru—Ta alloy cap layer is used as the alloy cap layer according to the first embodiment of the present invention. The abscissa of FIG. 6 indicates that the mixing ratio of Ru increases leftward so that an Ru pure metal is obtained at the left end, and the mixing ratio of Ta increases rightward so that a Ta pure metal is obtained at the right end.

As is apparent from FIG. 6, as the mixing ratio of Ta to Ru increases, the barrier resistance decreases, and the magnetoresistive ratio increases. This is probably because the increase in barrier resistance or the decrease in magnetoresistive ratio caused by abnormal oxidation of the free layer is suppressed by mixing Ta with a high ionization tendency in Ru with a low ionization tendency (see the model shown in FIG. 3B).

As is apparent from FIGS. 5 and 6, in, e.g., the Ru—Ta alloy cap layer, it is especially desirable that both the high thermal stability and the high MR ratio are implemented when the ratio of Ta to Ru falls within the range of 0 to about 0.5. Hence, to implement the high thermal stability and the high MR ratio, the alloy cap layer 114 is necessary, in which a metal (Ru) which has a low ionization tendency, low reactivity, and low diffusion and a metal (Ta) which has a high ionization tendency and prevents abnormal oxidation of the free layer are present at an appropriate mixing ratio. That is, a metal with a high ionization tendency supposedly has an effect of increasing the MR ratio by preventing abnormal oxidation of the magnetic layer. A metal with a low ionization tendency generally has a low reactivity and therefore supposedly has an effect of preventing diffusion to the magnetic layer.

More specifically, the materials and mixing ratio of the alloy cap layer 114 made of the first and second metal materials M1 and M2 to implement both the high thermal stability and the high MR ratio are as follows.

The first metal material M1 of the alloy cap layer 114 preferably contains a metal which has a high ionization tendency and prevents abnormal oxidation of the free layer 113, i.e., at least one element selected from the group (first element group) consisting of, e.g., Ti, V, Cr, Mn, Zn, Zr, Nb, Hf, Ta, Fe, and Co.

The second metal material M2 of the alloy cap layer 114 preferably contains a metal which has a low ionization tendency, low reactivity, and low diffusion, i.e., at least one element selected from the group (second element group) consisting of, e.g., Co, Ni, Cu, Mo, Ru, Rh, Pd, Ag, W, Re, Os, Ir, Pt, and Au.

To enable coexistence of the MR ratio increasing effect and the low diffusion/high thermal stability effect by the elements of the first and second element groups, the mixing ratio of the first metal material M1 and second metal material M2 of the alloy cap layer 114 is preferably set such that the abundance ratio of the element of the first element group to the element of the second element group falls within the range of 1:99 to 99:1.

The ionization tendency of a magnetic element increases in the order of Fe, Co, and Ni. For this reason, Fe of the first element group is applied when the major component of the magnetic layer is Co or Ni. Co of the first element group is applied when the major component of the magnetic layer is Ni. On the other hand, Co of the second element group is applied when the major component of the magnetic layer is Fe. Ni of the second element group is applied when the major component of the magnetic layer is Fe or Co. The elements of the first and second element groups may appropriately be selected from the elements shown in FIG. 2.

As the first and second metal materials M1 and M2 of the alloy cap layer 114, a combination of an element which has a relatively high melting point and is hard to diffuse to the free layer 113 in the first element group and a noble metal element which has an especially low reactivity in the second element group is used more preferably. More specifically, the alloy cap layer 114 preferably contains Ti—Cu, Ti—Ru, Ti—Rh, Ti—Pd, Ti—Ag, Ti—Ir, Ti—Pt, Ti—Au, Zr—Cu, Zr—Ru, Zr—Rh, Zr—Pd, Zr—Ag, Zr—Ir, Zr—Pt, Zr—Au, Nb—Cu, Nb—Ru, Nb—Rh, Nb—Pd, Nb—Ag, Nb—Ir, Nb—Pt, Nb—Au, Hf—Cu, Hf—Ru, Hf—Rh, Hf—Pd, Hf—Ag, Hf—Ir, Hf—Pt, or Hf—Au.

The main object of the alloy cap layer 114 is to protect magnetization of the free layer 113. Hence, the alloy cap layer 114 is preferably made of a nonmagnetic material so damage in the element formation process does not influence magnetization of the free layer 113.

(b) STANDARD ELECTRODE POTENTIAL OF ALLOY CAP LAYER

As described above, the standard electrode potentials V1 and V2 of the metal materials M1 and M2 contained in the alloy cap layer 114 preferably satisfy relationships V1<V, and V2>V with respect to the standard electrode potential V of the free layer 113 adjacent to the alloy cap layer 114. A standard electrode potential Va of the alloy of the alloy cap layer 114 will be described here.

The standard electrode potential Va of the alloy is calculated from the weighted average of standard electrode potentials corresponding to the concentrations of the constituent materials on the basis of the standard electrode potentials (FIG. 2) of the metals contained in the alloy. The standard electrode potential Va of an alloy containing, e.g., $Ru_8Ta_2$ can be obtained by $$+0.455 \times 8/(8+2) - 0.6 \times 2/(8+2) = +0.244(V) \quad (1)$$

It is simple and preferable to estimate the standard electrode potential Va of the alloy in this way.

Figure 7:
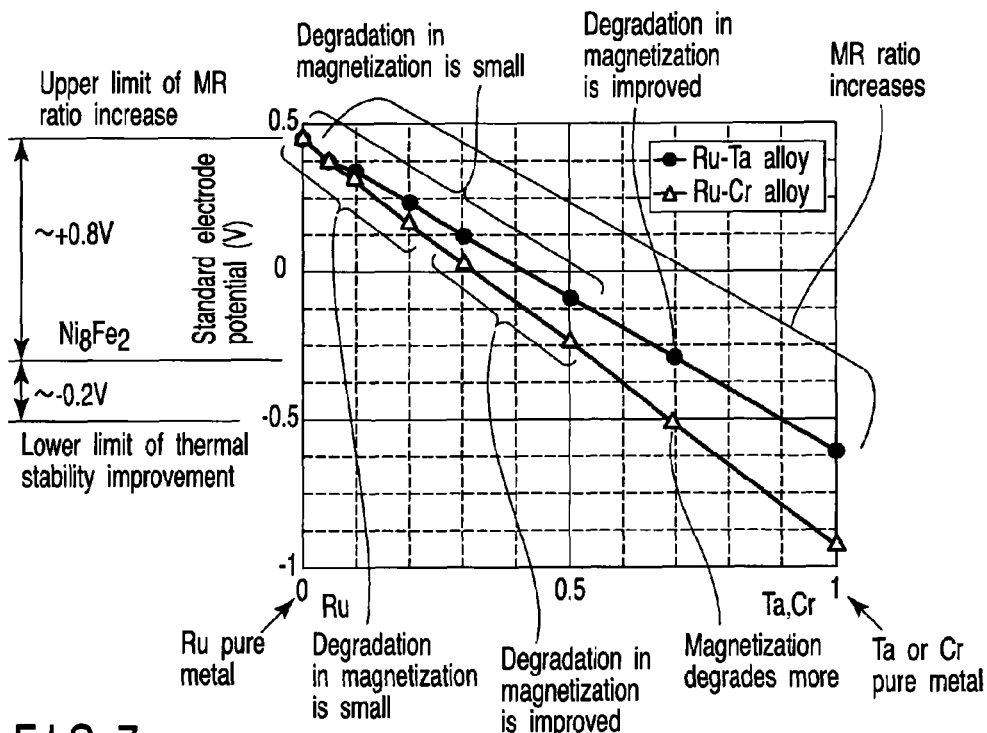
FIG. 7 is a graph showing the metal composition dependence of the standard electrode potential (ionization tendency) of an Ru—Ta or Ru—Cr alloy cap layer when the Ru—Ta or Ru—Cr alloy cap layer is used as the alloy cap layer according to the first embodiment of the present invention.

FIG. 7 is a graph showing the metal composition dependence of the standard electrode potential (ionization tendency) of an Ru—Ta or Ru—Cr alloy cap layer when the Ru—Ta or Ru—Cr alloy cap layer is used as the alloy cap layer according to the first embodiment of the present invention. The abscissa of FIG. 7 indicates that the mixing ratio of Ru increases leftward so that an Ru pure metal is obtained at the left end, and the mixing ratio of Ta or Cr increases rightward so that a Ta or Cr pure metal is obtained at the right end.

The standard electrode potential Va of the alloy cap layer 114 to improve the thermal stability is estimated on the basis of correspondence of FIGS. 5 and 7. As shown in FIG. 7, in both the Ru—Ta alloy cap layer and the Ru—Cr alloy cap layer, the degradation in magnetization improves when the difference between the standard electrode potential Va of the Ru—Ta or Ru—Cr alloy cap layer 114 and the standard electrode potential V of the free layer 113 made of $Ni_8Fe_2$ is about −0.2 V or more. When the ratio of Cr in the Ru—Cr alloy cap layer 114 is 0.7, magnetization degrades more than that in a Cr pure metal cap layer. In this case, the difference between the standard electrode potential Va of the alloy cap layer 114 and the standard electrode potential V of the free layer 113 made of $Ni_8Fe_2$ is about −0.2 V. Hence, the difference between the standard electrode potential V of the free layer 113 adjacent to the alloy cap layer 114 and the standard electrode potential Va of the alloy of the alloy cap layer 114 is preferably −0.2 V or more.

The standard electrode potential Va of the alloy cap layer 114 to increase the MR ratio is estimated on the basis of correspondence of FIGS. 6 and 7, As shown in FIG. 7, the difference between the standard electrode potential of the Ru pure metal cap layer having a low MR ratio and the standard electrode potential V of the free layer 113 made of $Ni_8Fe_2$ is about +0.8 V. To increase the MR ratio, the standard electrode potential Va of the alloy cap layer 114 is preferably lower (the ionization tendency is preferably higher). Hence, the difference between the standard electrode potential V of the free layer 113 adjacent to the alloy cap layer 114 and the standard electrode potential Va of the alloy of the alloy cap layer 114 is preferably +0.8 V or less.

To implement the high MR ratio and the high thermal stability simultaneously, the difference between the standard electrode potential V of the free layer 113 adjacent to the alloy cap layer 114 and the standard electrode potential Va of the alloy of the alloy cap layer 114 is preferably −0.2 V (inclusive) to +0.8 V (inclusive) in consideration of above-described two points.

FIGS. 8 to 15 are graphs showing the relationship between the metal composition ratio and the standard electrode potentials of detailed alloy cap layers according to the first embodiment of the present invention. As the free layer 113 adjacent to the alloy cap layer 114, three types of layers made of $Ni_8Fe_2$ (standard electrode potential: −0.295 V), Ni (standard electrode potential: −0.257 V), and Fe (standard electrode potential: −0.447 V) are used.

Figure 8:
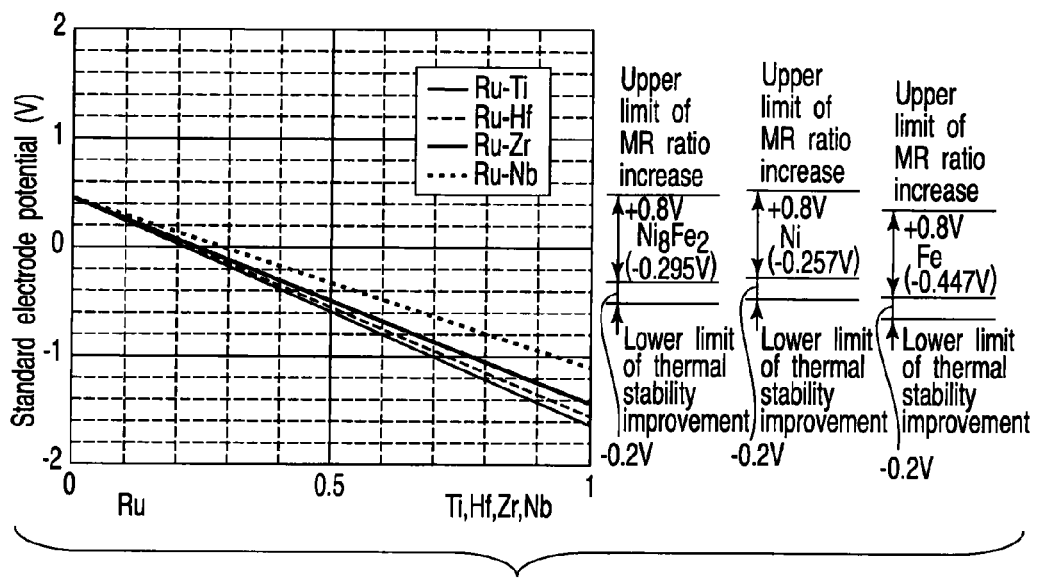
FIG. 8 is a graph showing the relationship between the metal composition ratio and the standard electrode potential of an alloy cap layer made of Ru—Ti, Ru—Hf, Ru—Zr, or Ru—Nb according to the first embodiment of the present invention.

FIG. 8 shows a case wherein Ti, Hf, Zr, and Nb are selected from the first element group as the first metal material M1 of the alloy cap layer 114, and Ru is selected from the second element group as the second metal material M2 of the alloy cap layer 114 so that the alloy cap layer 114 made of Ru—Ti, Ru—Hf, Ru—Zr, or Ru—Nb is used.

Figure 9:
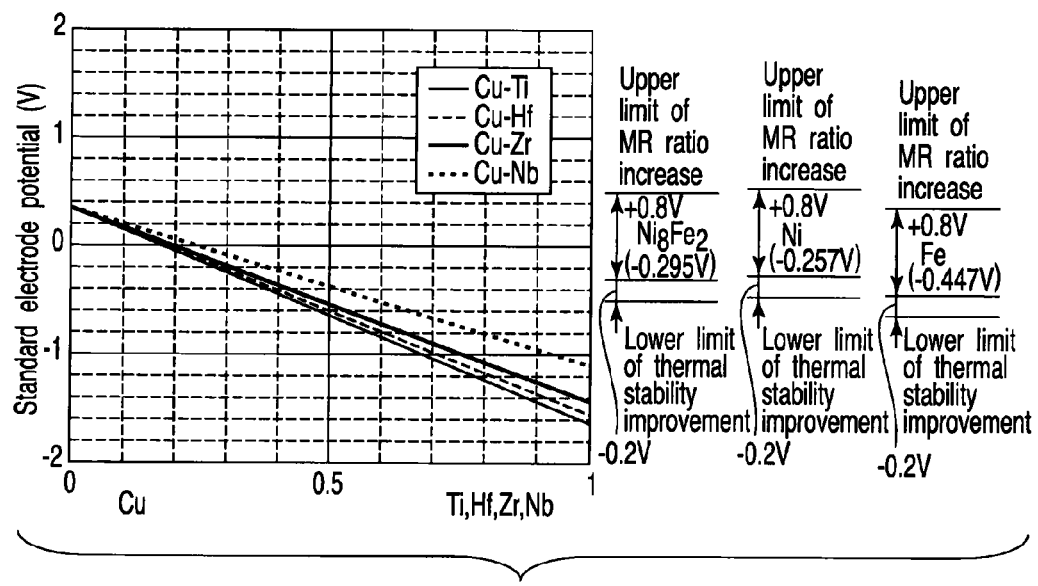
FIG. 9 is a graph showing the relationship between the metal composition ratio and the standard electrode potential of an alloy cap layer made of Cu—Ti, Cu—Hf, Cu—Zr, or Cu—Nb according to the first embodiment of the present invention.

FIG. 9 shows a case wherein Ti, Hf, Zr, and Nb are selected from the first element group as the first metal material M1 of the alloy cap layer 114, and Cu is selected from the second element group as the second metal material M2 of the alloy cap layer 114 so that the alloy cap layer 114 made of Cu—Ti, Cu—Hf, Cu—Zr, or Cu—Nb is used.

Figure 10:
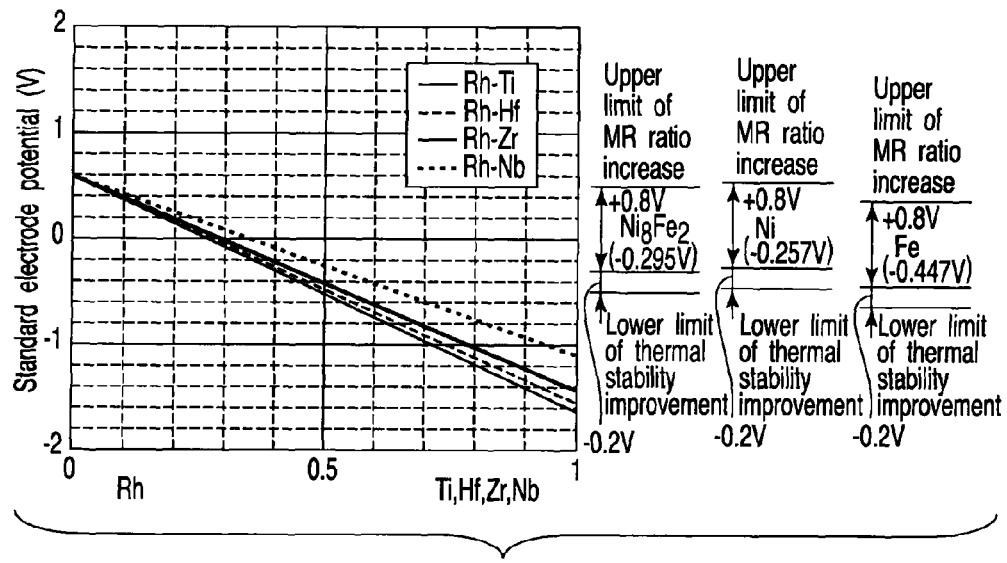
FIG. 10 is a graph showing the relationship between the metal composition ratio and the standard electrode potential of an alloy cap layer made of Rh—Ti, Rh—Hf, Rh—Zr, or Rh—Nb according to the first embodiment of the present invention.

FIG. 10 shows a case wherein Ti, Hf, Zr, and Nb are selected from the first element group as the first metal material M1 of the alloy cap layer 114, and Rh is selected from the second element group as the second metal material M2 of the alloy cap layer 114 so that the alloy cap layer 114 made of Rh—Ti, Rh—Hf, Rh—Zr, or Rh—Nb is used.

Figure 11:
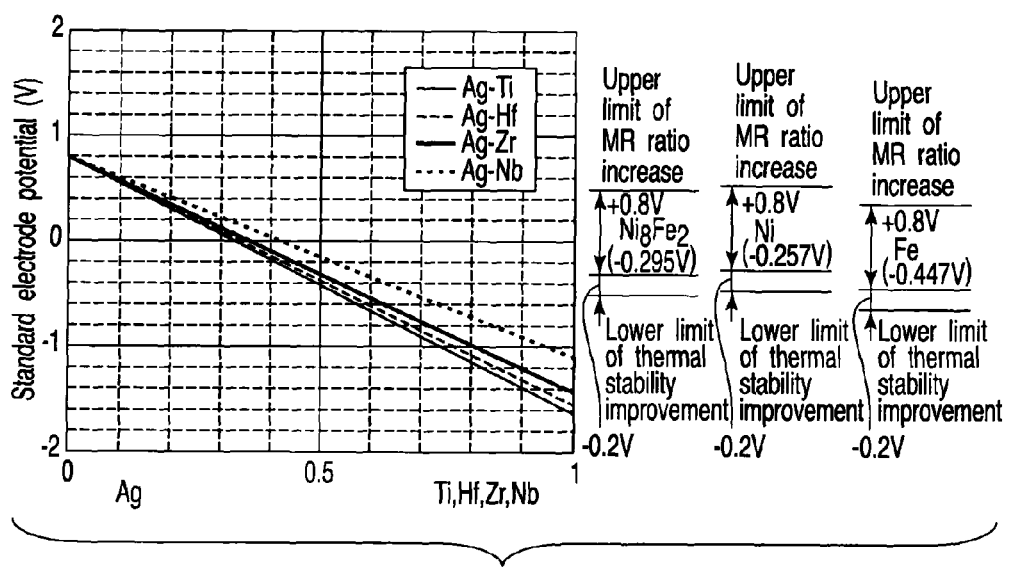
FIG. 11 is a graph showing the relationship between the metal composition ratio and the standard electrode potential of an alloy cap layer made of Ag—Ti, Ag—Hf, Ag—Zr, or Ag—Nb according to the first embodiment of the present invention.

FIG. 11 shows a case wherein Ti, Hf, Zr, and Nb are selected from the first element group as the first metal material M1 of the alloy cap layer 114, and Ag is selected from the second element group as the second metal material M2 of the alloy cap layer 114 so that the alloy cap layer 114 made of Ag—Ti, Ag—Hf, Ag—Zr, or Ag—Nb is used.

FIG. 12 shows a case wherein Ti, Hf, Zr, and Nb are selected from the first element group as the first metal material M1 of the alloy cap layer 114, and Pd is selected from the second element group as the second metal material M2 of the alloy cap layer 114 so that the alloy cap layer 114 made of Pd—Ti, Pd—Hf, Pd—Zr, or Pd—Nb is used.

FIG. 13 shows a case wherein Ti, Hf, Zr, and Nb are selected from the first element group as the first metal material M1 of the alloy cap layer 114, and Ir is selected from the second element group as the second metal material M2 of the alloy cap layer 114 so that the alloy cap layer 114 made of Ir—Ti, Ir—Hf, Ir—Zr, or Ir—Nb is used.

Figure 14:
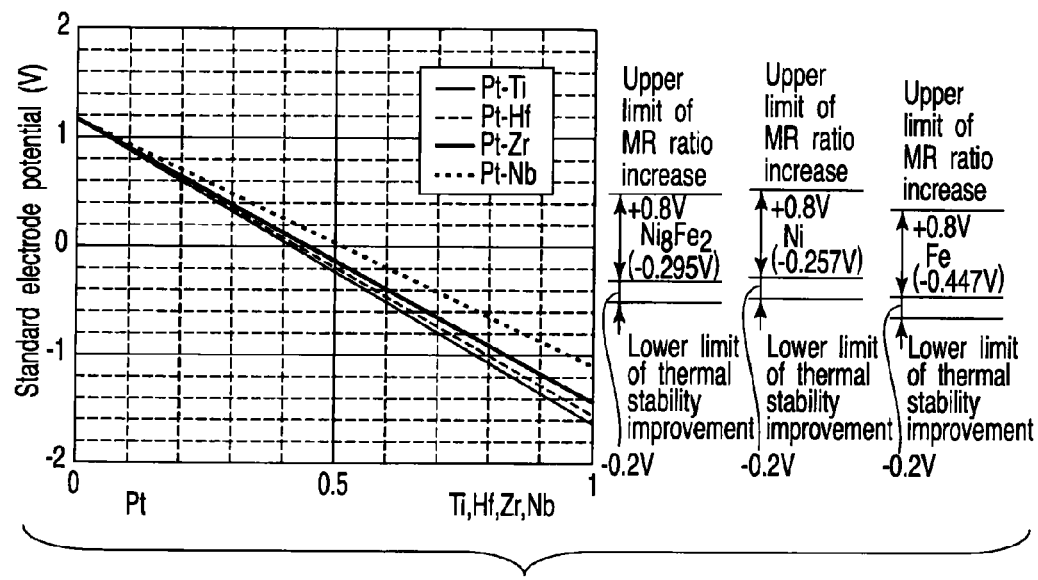
FIG. 14 is a graph showing the relationship between the metal composition ratio and the standard electrode potential of an alloy cap layer made of Pt—Ti, Pt—Hf, Pt—Zr, or Pt—Nb according to the first embodiment of the present invention.

FIG. 14 shows a case wherein Ti, Hf, Zr, and Nb are selected from the first element group as the first metal material M1 of the alloy cap layer 114, and Pt is selected from the second element group as the second metal material M2 of the alloy cap layer 114 so that the alloy cap layer 114 made of Pt—Ti, Pt—Hf, Pt—Zr, or Pt—Nb is used.

Figure 15:
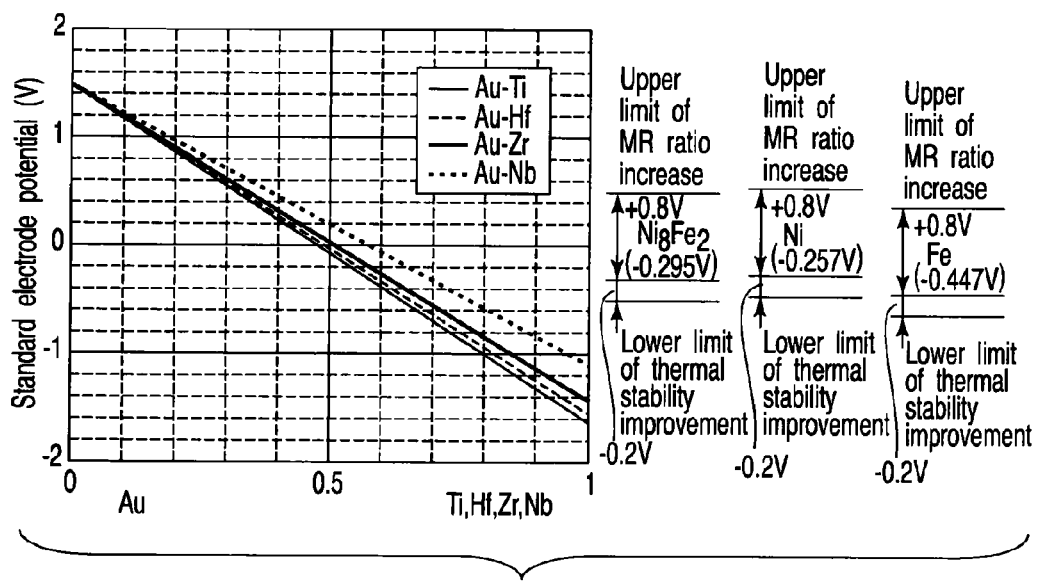
FIG. 15 is a graph showing the relationship between the metal composition ratio and the standard electrode potential of an alloy cap layer made of Au—Ti, Au—Hf, Au—Zr, or Au—Nb according to the first embodiment of the present invention.

FIG. 15 shows a case wherein Ti, Hf, Zr, and Nb are selected from the first element group as the first metal material M1 of the alloy cap layer 114, and Au is selected from the second element group as the second metal material M2 of the alloy cap layer 114 so that the alloy cap layer 114 made of Au—Ti, Au—Hf, Au—Zr, or Au—Nb is used.

FIGS. 8 to 15 show preferable ranges of the standard electrode potential Va of the alloy of the alloy cap layer 114 to implement both the high MR ratio and the high thermal stability. When the composition of the free layer 113 changes, and the weighted average of the standard electrode potential V of the free layer 113 changes, the preferable range of the standard electrode potential Va of the alloy cap layer 114 also changes. However, independently of the material selected for the free layer 113 adjacent to the alloy cap layer 114, both the high MR ratio and the high thermal stability can be implemented simultaneously when the difference between the standard electrode potential Va of the alloy of the alloy cap layer 114 and the standard electrode potential V of the free layer 113 is −0.2 V (inclusive) to +0.8 V (inclusive).

(c) EXAMPLE

Example 1

FIG. 16 is a sectional view of an MTJ element according to Example 1 of the present invention. The structure of the MTJ element according to Example 1 will be described below.

As shown in FIG. 16, an MTJ element 100 according to Example 1 includes a lower interconnection connecting layer 121 made of Ta (thickness: 5 nm), a buffer layer 122 made of Ru (thickness: 1 nm), an antiferromagnetic layer 123 made of Pt—Mn (thickness: 15 nm), a magnetization pinned layer 111 made of Co—Fe (thickness: 5 nm), a tunnel barrier layer 112 made of aluminum oxide ($AlO_x$) (thickness: 1 nm), a free layer 113 made of Ni—Fe (thickness: 4 nm), an alloy cap layer 114 made of an Ru—Ta alloy or Ru—Cr alloy (thickness: 3 nm), and a mask layer 124 made of Ta (thickness: 50 nm). The mask layer 124 functions as an etching mask, surface protection layer, and upper interconnection connecting layer.

Example 2

FIG. 17 is a sectional view of an MTJ element according to Example 2 of the present invention. The structure of the MTJ element according to Example 2 will be described below.

As shown in FIG. 17, an MTJ element 100 according to Example 2 has a so-called synthetic ferrimagnetic pinned layer structure in which a magnetization pinned layer 111 includes a ferromagnetic layer 111a/nonmagnetic layer 111b/ferromagnetic layer 111c. The ferromagnetic layers 111a and 111c are antiferromagnetically coupled.

More specifically, the MTJ element 100 includes a lower interconnection connecting layer 121 made of Ta (thickness: 5 nm), an antiferromagnetic layer 123 made of Pt—Mn (thickness: 15 nm), the magnetic layer 111a made of Co—Fe (thickness: 2 nm), the nonmagnetic layer 111b made of an Ru—Ta alloy, the magnetic layer 111c made of Co—Fe (thickness: 2 nm), a tunnel barrier layer 112 made of aluminum oxide ($AlO_x$) (thickness: 1 nm), a free layer 113 made of Ni—Fe (thickness: 4 nm), an alloy cap layer 114 made of an Ru—Ta alloy or Ru—Cr alloy (thickness: 3 nm), and a mask layer 124 made of Ta (thickness: 50 nm).

Normally, a metal such as Ru having a low ionization tendency is used as the nonmagnetic layer 111b in the magnetization pinned layer 111 with the synthetic ferrimagnetic pinned layer structure. In Example 2, an alloy is used, like the alloy cap layer 114. When a metal having a high ionization tendency is added to even the nonmagnetic layer 111b at a concentration ratio not to cause any degradation in thermal stability or magnetic characteristic of the synthetic ferrimagnetic pinned layer, abnormal oxidation of the interface between the magnetic layer 111c and the tunnel barrier layer 112 is prevented, and the MR ratio increases.

Example 3

Figure 18:
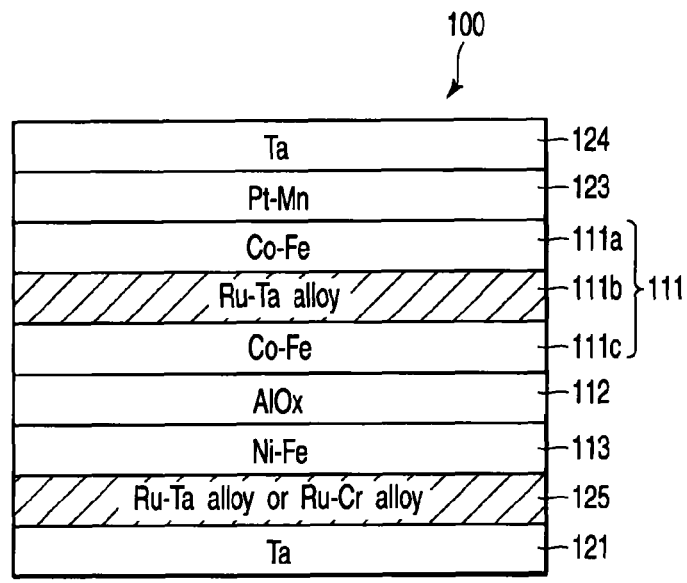
FIG. 18 is a sectional view showing an MTJ element according to Example 3 of the present invention.

FIG. 18 is a sectional view of an MTJ element according to Example 3 of the present invention. The structure of the MTJ element according to Example 3 will be described below.

As shown in FIG. 18, an MTJ element 100 according to Example 3 has a top-pin structure in which a magnetization pinned layer 111 is arranged on a tunnel barrier layer 112, not a bottom-pin structure in which the magnetization pinned layer 111 is arranged under the tunnel barrier layer 112 as in Examples 1 and 2.

More specifically, the MTJ element 100 includes a lower interconnection connecting layer 121 made of Ta (thickness: 5 nm), a lower layer 125 of a free layer, which is made of an Ru—Ta alloy or Ru—Cr alloy (thickness: 3 nm), a free layer 113 made of Ni—Fe (thickness: 4 nm), a tunnel barrier layer 112 made of aluminum oxide (AlO$_x$) (thickness: 1 nm), a magnetic layer 111c made of Co—Fe (thickness: 2 nm), a nonmagnetic layer 111b made of an Ru—Ta alloy, a magnetic layer 111a made of Co—Fe (thickness: 2 nm), an antiferromagnetic layer 123 made of Pt—Mn (thickness: 15 nm), and a mask layer 124 made of Ta (thickness: 50 nm).

The same alloy layer as the above-described alloy cap layer 114 is applied to the lower layer 125 of the free layer and the nonmagnetic layer 111b. With this structure, abnormal oxidation of the interface between the tunnel barrier layer 112 and the free layer 113 and the interface between the tunnel barrier layer 112 and the magnetic layer 111c is prevented. In addition, element diffusion from the lower layer 125 of the free layer to the free layer 113 and element diffusion from the nonmagnetic layer 111b to the magnetic layer 111c are suppressed. Hence, both the MR ratio and the thermal stability of the MTJ element 100 can be improved.

Example 4

FIGS. 19A to 19F are sectional views showing steps in manufacturing a portion near a memory cell of an MTJ element according to Example 4 of the present invention. The method of manufacturing the portion near the memory cell of the MTJ element will be described below. Layers under the alloy cap layer 114 in FIG. 16 or 17 are simply shown as a lower layer 202 of the cap layer.

Figure 19A:
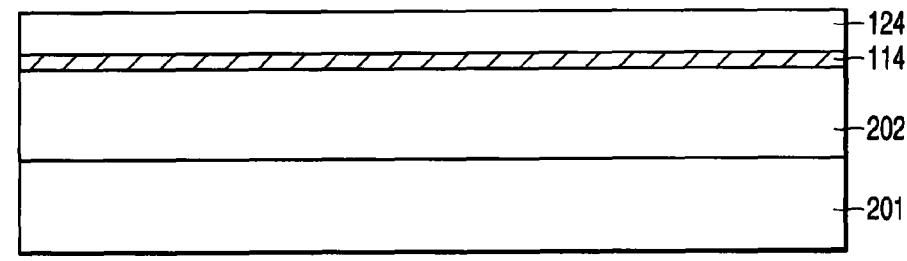
FIGS. 19A, 19B, 19C, 19D, 19E, and 19F are sectional views showing steps in manufacturing a portion near a memory cell of an MTJ element according to Example 4 of the present invention.

As shown in FIG. 19A, a lower interconnection layer 201 is formed on a substrate (not shown). Examples of the material of the lower interconnection layer 201 are Al, Al—Cu, Cu, Ta, W, and Ag. The lower layer 202 of the cap layer, an alloy cap layer 114 made of Ru—Ta, Ru—Cr, or Ni—Fe—Zr, and a mask layer 124 are sequentially formed on the lower interconnection layer 201 by, e.g., high-vacuum sputtering. Instead of high-vacuum sputtering, deposition, chemical vapor deposition (CVD), or atomic layer deposition (ALD) may be used. In forming the barrier layer in the lower layer 202 of the cap layer, a metal (e.g., Al) to be oxidized/nitrided may be deposited and then oxidized by using oxygen plasma, oxygen radical, ozone, or oxygen gas atmosphere or nitrided by using nitrogen plasma or nitrogen radical.

Figure 19B:
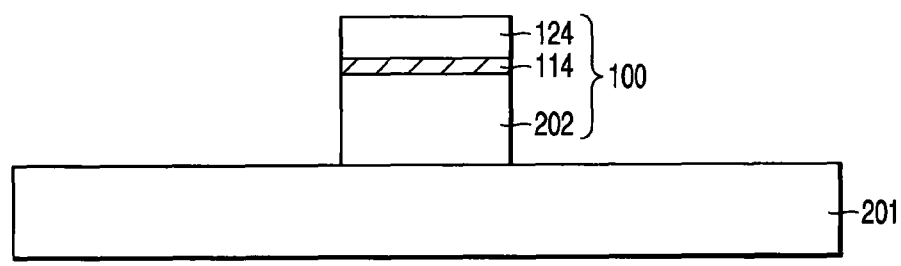

As shown in FIG. 19B, the lower layer 202 of the cap layer, the alloy cap layer 114, and the mask layer 124 are selectively etched by, e.g., ion milling.

Figure 19C:
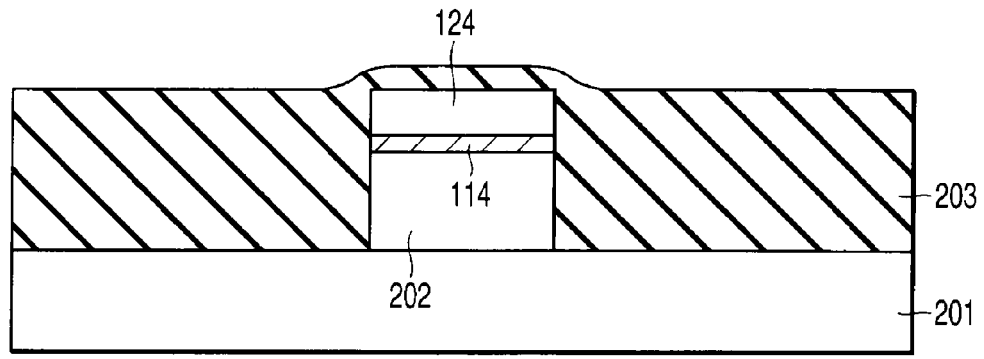

As shown in FIG. 19C, an insulating film 203 to protect an MTJ element 100 in the next step is formed by, e.g., sputtering or chemical vapor deposition (CVD). As the material of the insulating film 203, for example, a silicon oxide film (SiO$_x$) or silicon nitride film (SiN$_x$) is used.

Next, the lower interconnection layer 201 is selectively etched by, e.g., reactive ion etching (RIE). Although not illustrated, processed portions of the lower interconnection layer 201 are present on, e.g., the near and far sides of the drawing surface of FIG. 19C. At this time, the MTJ element 100 is protected by the insulating film 203 shown in FIG. 19C.

Figure 19D:
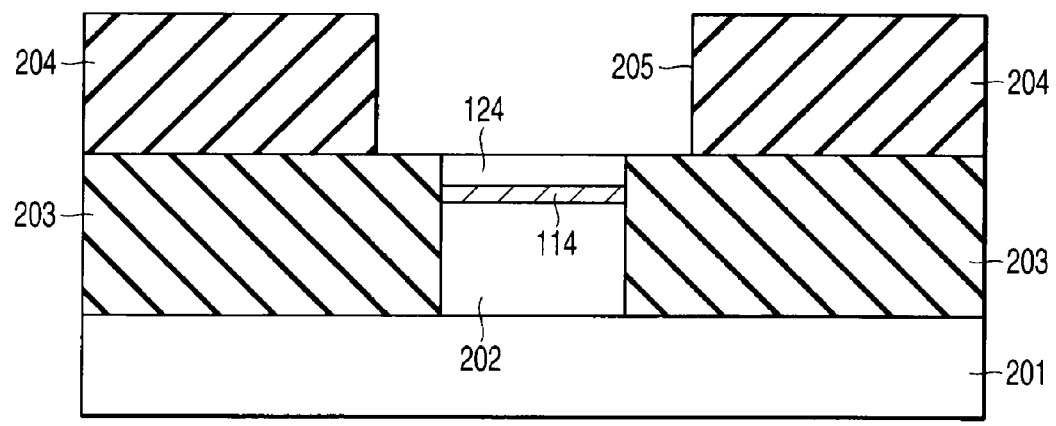

As shown in FIG. 19D, an insulating film 204 is formed on the insulating film 203 by, e.g., sputtering or chemical vapor deposition. As the material of the insulating film 204, for example, a silicon oxide film (SiO$_x$) or silicon nitride film (SiN$_x$) is used. The insulating film 204 is selectively etched to form a contact hole 205 to electrically connect the mask layer 124 and lower interconnection layer 201. Although not illustrated, contact holes to the lower interconnection layer 201 are formed on, e.g., the left and right outer sides of FIG. 19D.

Figure 19E:
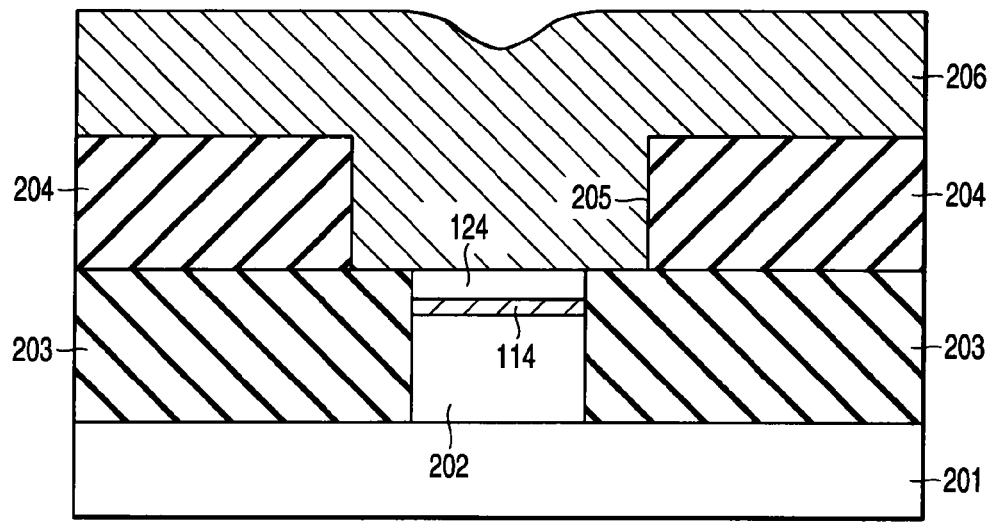

As shown in FIG. 19E, an upper interconnection layer 206 is formed on the insulating film 204 and in the contact hole 205. Examples of the material of the upper interconnection layer 206 are Al, Al—Cu, Cu, Ta, W, and Ag.

Figure 19F:
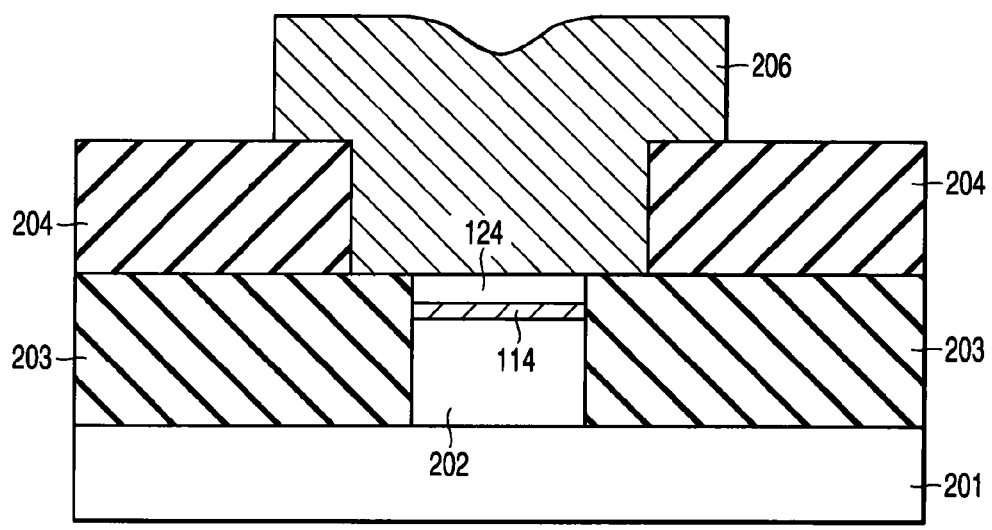

Finally, as shown in FIG. 19F, the upper interconnection layer 206 is selectively etched by, e.g., reactive ion etching. Formation of the portion near the memory cell is thus ended.

As described above, according to the first embodiment, the alloy cap layer 114 is provided adjacent to the free layer 113 of the MTJ element 100. The alloy cap layer 114 is made of the first metal material M1 having the standard electrode potential V1 lower than the standard electrode potential V of the free layer 113 (the ionization tendency is high) and the second metal material M2 having the standard electrode potential V2 higher than the standard electrode potential V of the free layer 113 (the ionization tendency is low). When the alloy cap layer 114 is used, the free layer 113 is charged to δ− by the function of the first metal material M1 having the high ionization tendency. Hence, abnormal oxidation of the free layer 113, which is caused by rediffusion of the oxidation species in magnetic annealing after TMR film formation, is suppressed, and the magnetoresistive ratio increases. On the other hand, element diffusion from the alloy cap layer 114 to the free layer 113 is suppressed by the effect of the second metal material M2 having a low reactivity and low ionization tendency, and a high thermal stability is obtained as an MTJ characteristic. When the above-described two effects are simultaneously obtained by the alloy cap layer 114, both the high thermal stability and the high MR ratio can be implemented.

In the first embodiment, the thickness of each layer of the MTJ element 100 may appropriately be adjusted within the range of several Å to several tens of nm. As the material of each layer of the MTJ element 100, a material different from those described above may be used. The structure may also be reversed. As the tunnel barrier layer 112, MgO, AlN, AlON, AlHfO$_x$, AlZrO$_x$, or AlFO$_x$ may be used. A ferromagnetic double tunnel junction structure including a plurality of tunnel barrier layers 112 may be employed. The free layer 113 need not always have a single-layer structure and may have a multilayer structure including a ferromagnetic layer/nonmagnetic layer/ferromagnetic layer.

[1-2] Second Embodiment

The second embodiment is different from the first embodiment in the material of the alloy cap layer. A magnetic material is used for the alloy cap layer.

Figure 20:
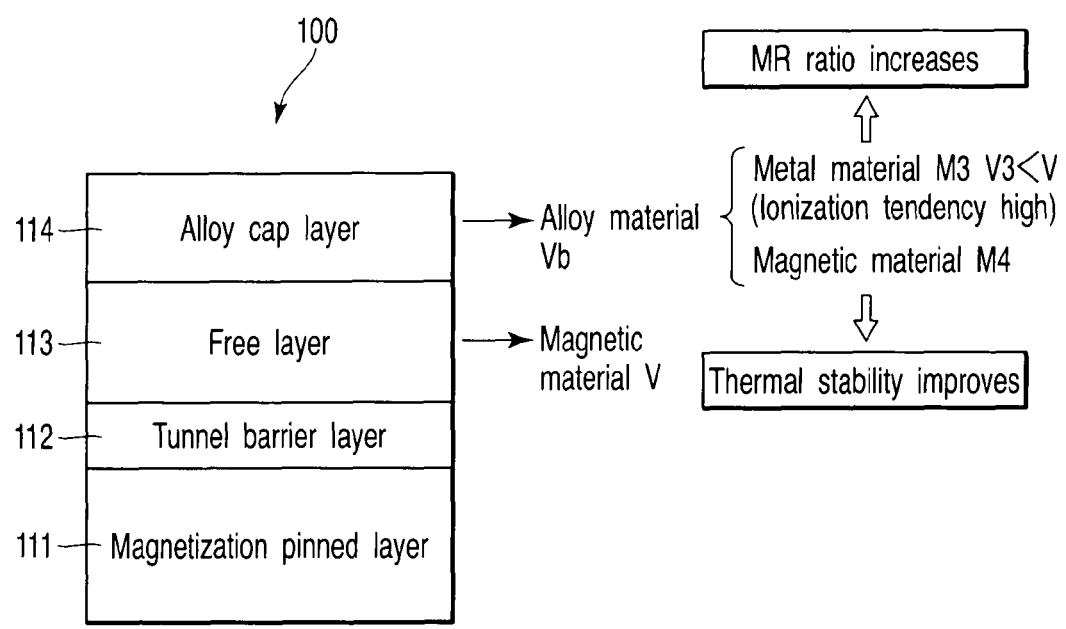
FIG. 20 is a schematic view showing an MTJ element according to the second embodiment of the present invention.

FIG. 20 is a schematic view showing an MTJ element according to the second embodiment of the present invention.

The outline of the structure of the MTJ element according to the second embodiment will be described below.

As shown in FIG. 20, an MTJ element 100 according to the second embodiment includes a magnetization pinned layer (magnetic layer) 111 whose magnetization is fixed, a free layer (magnetic layer) 113 whose magnetization reverses, a tunnel barrier layer (nonmagnetic layer) 112 sandwiched between the magnetization pinned layer 111 and the free layer 113, and an alloy cap layer 114 in contact with the free layer 113, as in the first embodiment.

The alloy cap layer 114 is made of an alloy of a metal material M3 and a magnetic material M4. A standard electrode potential V3 of the metal material M3 is lower than a standard electrode potential V of the free layer 113 adjacent to the alloy cap layer 114 (the ionization tendency is high).

Figure 21:
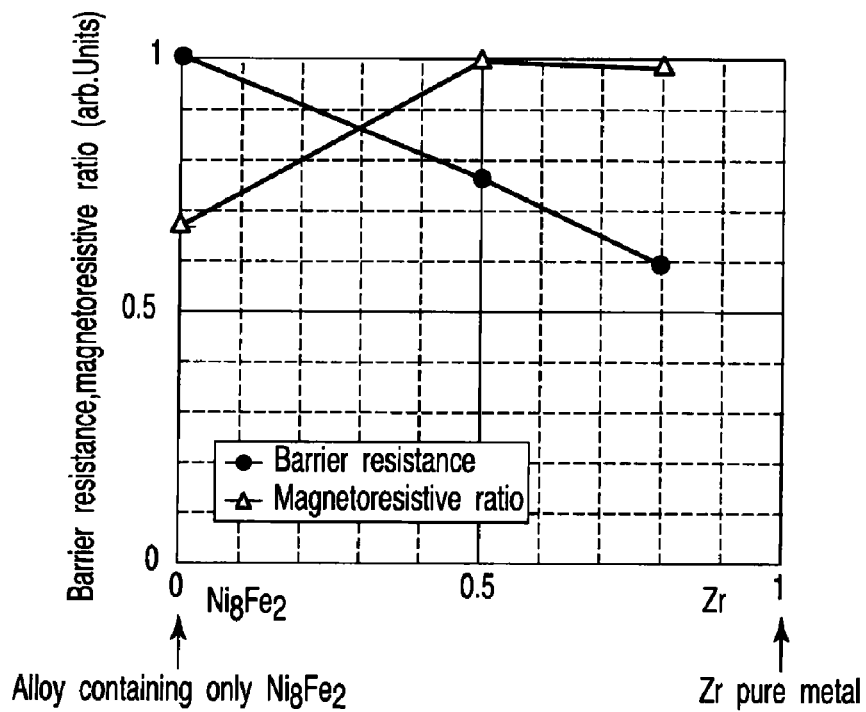
FIG. 21 is a graph showing the NiFe—Zr composition dependence of the barrier resistance and magnetoresistive ratio of an MTJ element when an Ni—Fe—Zr alloy cap layer is used as an alloy cap layer according to the second embodiment of the present invention.

FIG. 21 is a graph showing the NiFe—Zr composition dependence of the barrier resistance and magnetoresistive ratio of the MTJ element when an NiFe—Zr alloy cap layer is used as the alloy cap layer according to the second embodiment of the present invention. The abscissa of FIG. 21 indicates that the mixing ratio of NiFe increases leftward so that an alloy containing only NiFe is obtained at the left end, and the mixing ratio of Zr increases rightward so that a Zr pure metal is obtained at the right end.

The alloy cap layer 114 made of Ni—Fe—Zr uses Zr as the metal material M3 and Ni—Fe as the magnetic material M4. The standard electrode potential V3 of Zr is lower than that of Ni or Fe contained in the free layer 113 so that the ionization tendency is high. When the Zr concentration in the alloy cap layer 114 is high, abnormal oxidation of the free layer 113 is prevented (see the model shown in FIG. 3B), the barrier resistance decreases, and the magnetoresistive ratio increases. In this case, no metal having a lower ionization tendency than Ni or Fe of the free layer 113 is present in the alloy cap layer 114. Hence, the metal material M3 having a high ionization tendency may be diffused from the alloy cap layer 114 to the free layer 113 upon annealing. However, since the magnetic material M4 is also diffused from the alloy cap layer 114 simultaneously, the magnetization change in the free layer 113 is minimized. Hence, the MTJ element 100 having a high thermal stability and a high MR ratio is implemented.

The materials of the alloy cap layer 114 made of the magnetic material M4 and the metal material M3 having an ionization tendency higher than the free layer 113 are as follows.

The magnetic material M4 of the alloy cap layer 114 preferably contains at least one element selected from the group (third element group) consisting of Co, Fe, and Ni.

The metal material M3 of the alloy cap layer 114, which has a high ionization tendency (negative standard electrode potential), preferably contains at least one element selected from the group (fourth element group) consisting of Ti, V, Cr, Mn, Zn, Zr, Nb, Hf, and Ta.

To enable coexistence of the effects of elements of both groups, the abundance ratio of the element of the fourth element group to the element of the third element group preferably falls within the range of 1% to 99%.

As the magnetic material M4 and metal material M3 of the alloy cap layer 114, an element which has a relatively high melting point and is hard to diffuse to the free layer 113 in the fourth element group is used preferably. More specifically, the alloy cap layer 114 preferably contains Co—Ti, Co—Zr, Co—Nb, Co—Hf, Fe—Ti, Fe—Zr, Fe—Nb, Fe—Hf, Ni—Ti, Ni—Zr, Ni—Nb, or Ni—Hf. The elements of the fourth element group may appropriately be selected from the elements shown in FIG. 2.

More preferably, the alloy cap layer 114 uses an alloy of the magnetic metal M4 which is the same as the major component of the free layer 113 and the metal material M3 whose standard electrode potential is located on the negative side of that of the magnetic metal M4 and whose solubility limit to the magnetic metal M4 is 5% or less. When the concentration of the metal of the metal material M3 is higher than 5%, the metal elutes to the free layer 113 in the hot process. However, since the magnetic metal M4 which is the same as the major component of the free layer 113 also elutes simultaneously, the magnetization change in the free layer 113 is further suppressed.

More specifically, the alloy cap layer 114 preferably contains two of the magnetic elements Co, Fe, and Ni, which have the first and second largest contents in the free layer 113, and at least one element of Zr, Nb, Hf, and Ti.

For example, when the elements having the first and second largest contents in the free layer 113 are Co and Fe, the alloy cap layer 114 preferably contains Co—Fe—Zr, Co—Fe—Nb, Co—Fe—Hf, or Co—Fe—Ti. When the elements having the first and second largest contents in the free layer 113 are Co and Ni, the alloy cap layer 114 preferably contains Co—Ni—Zr, Co—Ni—Nb, Co—Ni—Hf, or Co—Ni—Ti. When the elements having the first and second largest contents in the free layer 113 are Fe and Ni, the alloy cap layer 114 preferably contains Ni—Fe—Zr, Ni—Fe—Nb, Ni—Fe—Hf, or Ni—Fe—Ti.

As described above, according to the second embodiment, the alloy cap layer 114 is provided adjacent to the free layer 113 of the MTJ element 100. The alloy cap layer 114 is made of the magnetic material M4 and the metal material M3 having the standard electrode potential V3 lower than the standard electrode potential V of the free layer 113 (the ionization tendency is high). When the alloy cap layer 114 is used, the free layer 113 is charged to δ− by the function of the metal M3 having the high ionization tendency. Hence, abnormal oxidation of the free layer 113, which is caused by rediffusion of the oxidation species in magnetic annealing after TMR film formation, is suppressed, and the magnetoresistive ratio increases. On the other hand, since the magnetic material M4 is diffused to the free layer 113 together with the metal material M3 having the high ionization tendency, the decrease in magnetization of the free layer 113 is suppressed, and a high thermal stability is obtained as an MTJ characteristic. When the above-described two effects are simultaneously obtained by the alloy cap layer 114, both the high thermal stability and the high MR ratio can be implemented.

In the second embodiment, to implement the high thermal stability and the high MR ratio simultaneously, the difference between a standard electrode potential Vb of the alloy of the alloy cap layer 114 made of the magnetic material M4 and metal material M3 and the standard electrode potential V of the adjacent free layer 113 is also preferably −0.2 V (inclusive) to +0.8 V (inclusive), as in the first embodiment.

[1-3] Third Embodiment

In the third embodiment, a diffusion suppressing layer is provided between an alloy cap layer and a magnetic layer adjacent to the alloy cap layer in the first and second embodiments.

Figure 22:
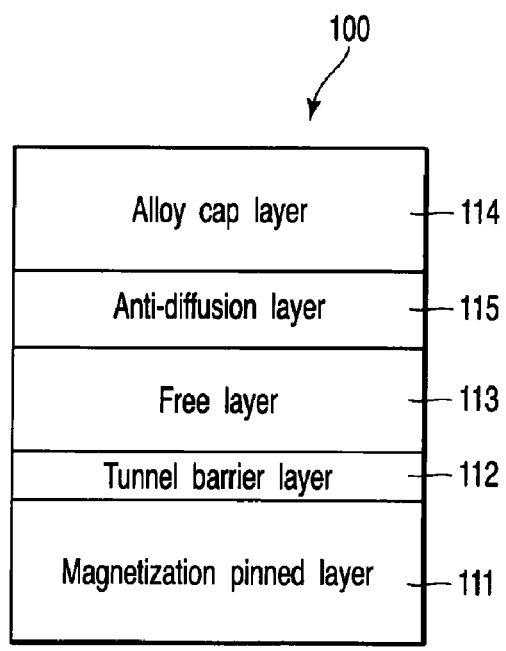
FIG. 22 is a schematic view showing an MTJ element according to the third embodiment of the present invention.

FIG. 22 is a schematic view showing an MTJ element according to the third embodiment of the present invention. The outline of the structure of the MTJ element according to the third embodiment will be described below.

As shown in FIG. 22, in an MTJ element 100 according to the third embodiment, a diffusion suppressing layer 115 is provided between an alloy cap layer 114 and a free layer 113 to enhance the anti-diffusion function from the alloy cap layer 114 to the free layer 113.

The diffusion suppressing layer 115 is made of a metal oxide, metal nitride, or metal oxynitride. More specifically, the diffusion suppressing layer 115 is made of an oxide, nitride, or oxynitride of an element containing at least one element selected from the group (fifth element group) consisting of, e.g., Al, Mg, Cr, V, B, W, Ti, Zr, Hf, and Ta. Preferably, a relatively stable oxide or nitride is used. The effect is especially large in, e.g., $AlO_x$, MgO, $CrO_x$, $VO_x$, BN, WN, TiN, $ZrO_x$, ZrN, $HfO_x$, HfN, $TaO_x$, or TaN.

The diffusion suppressing layer 115 can be either an insulating or conductive layer. If the diffusion suppressing layer 115 has insulating properties, its thickness is preferably as small as about 2 nm or less to maintain the effect of preventing abnormal oxidation by exchanging charges between the alloy cap layer 114 and the free layer 113 and charging the free layer 113 to δ−. In addition, the diffusion suppressing layer 115 is preferably nonmagnetic.

As described above, according to the third embodiment, the same effect as in the first and second embodiments can be obtained. In addition, when the diffusion suppressing layer 115 is provided between the alloy cap layer 114 and the free layer 113, the function of preventing diffusion from the alloy cap layer 114 to the free layer 113 can further be increased.

[2] Magnetic Random Access Memory

A magnetic random access memory according to an embodiment of the present invention will be described next. In this magnetic random access memory, the MTJ element 100 having the above-described alloy cap layer 114 is used as the memory element of a memory cell. As examples of the memory cell structure of the magnetic random access memory, [2-1] select transistor cell, [2-2] select diode cell, [2-3] cross-point cell, and [2-4] toggle cell will be described here.

[2-1] Select Transistor Cell

Figure 23A:
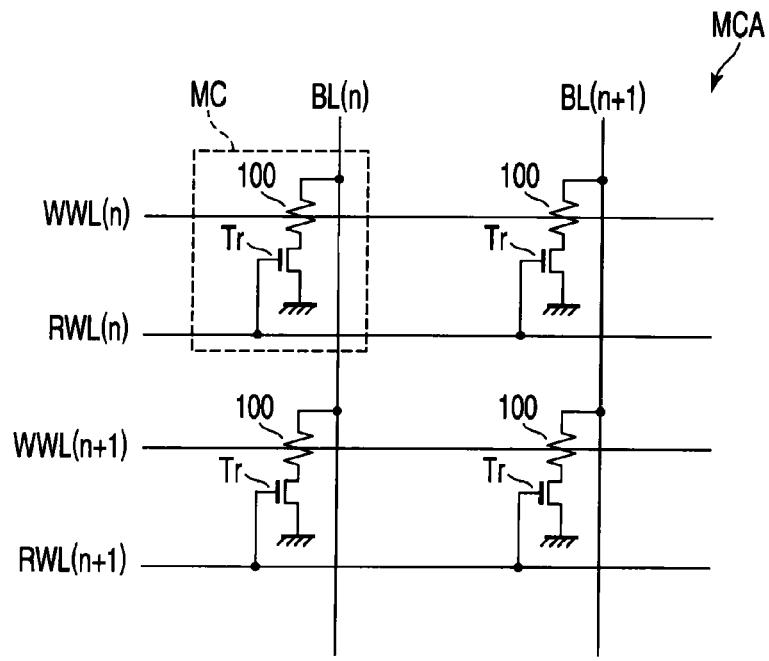
Figure 23B:
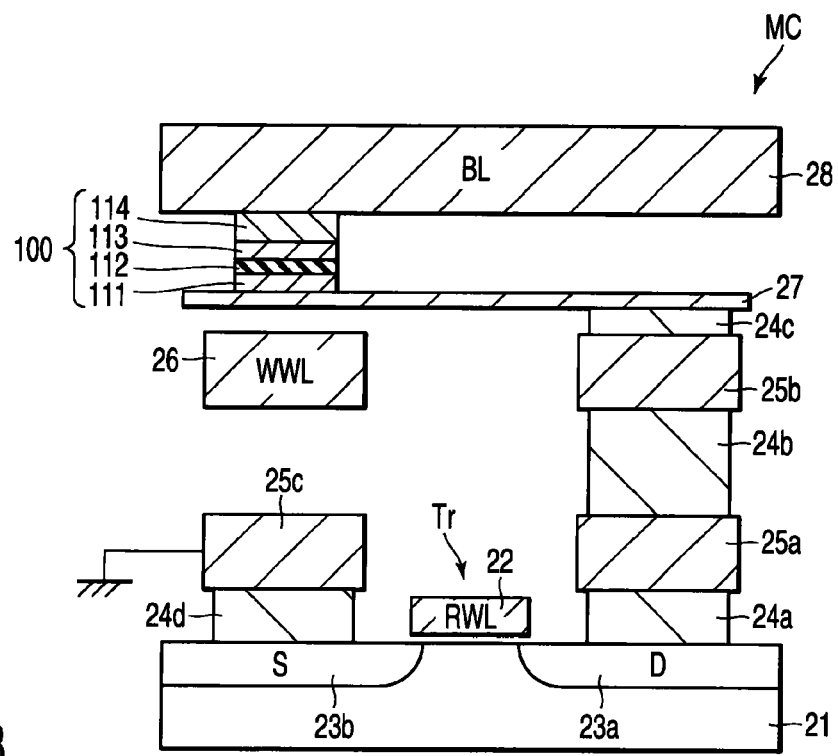

FIGS. 23A and 23B show select transistor memory cells of the magnetic random access memory according to the embodiment of the present invention. The transistor cell structure will be described below.

As shown in FIGS. 23A and 23B, one cell MC having a select transistor structure includes one MTJ element 100, a transistor (e.g., a MOS transistor) Tr connected to the MTJ element 100, a bit line (BL) 28, and a write word line (WWL) 26. A memory cell array MCA is formed by laying out a plurality of memory cells MC in an array.

More specifically, one terminal of the MTJ element 100 is connected to one end (drain diffusion layer) 23a of the current path of the transistor Tr through a base metal layer 27, contacts 24a, 24b, and 24c, and interconnections 25a and 25b. The other terminal of the MTJ element 100 is connected to the bit line 28. The write word line 26 electrically disconnected from the MTJ element 100 is provided under the MTJ element 100. The other end (source diffusion layer) 23b of the current path of the transistor Tr is connected to, e.g., ground through a contact 24d and interconnection 25c. A gate electrode 22 of the transistor Tr functions as a read word line (RWL).

One terminal of the MTJ element 100 on the side of the base metal layer 27 is, e.g., a magnetization pinned layer 111. The other terminal of the MTJ element 100 on the side of the bit line 28 is, e.g., an alloy cap layer 114. The arrangement may be reversed, as a matter of course. The axis of easy magnetization of the MTJ element 100 can be arranged in various directions with respect to the running direction of the write interconnection. For example, the axis of easy magnetization can be arranged either in the running direction of the bit line 28 or in the running direction of the write word line 26.

In the above-described select transistor memory cell, the data write and read are executed in the following way.

The write operation is executed in the following way. The bit line 28 and write word line 26 corresponding to a selected one of the plurality of MTJ elements 100 are selected. Write currents Iw1 and Iw2 are supplied to the selected bit line 28 and write word line 26, respectively. A synthetic field H by the write currents Iw1 and Iw2 is applied to the MTJ element 100. The magnetization of a free layer 113 of the MTJ element 100 is reversed so that a state wherein the magnetization directions of the magnetization pinned layer 111 and free layer 113 are parallel or a state wherein the magnetization directions are anti-parallel is set. When the parallel state is defined as, e.g., a "1" state, and the anti-parallel state is defined as a "0" state, a binary data write is implemented.

The read operation is executed in the following way by using the transistor Tr which functions as a read switching element. The bit line 28 and read word line (RWL) corresponding to the selected MTJ element 100 are selected. A read current Ir which tunnels through a tunnel barrier layer 112 of the MTJ element 100 is supplied. The junction resistance value changes in proportion to the cosine of the relative angle between the magnetization of the magnetization pinned layer 111 and that of the free layer 113. When the magnetization of the MTJ element 100 is in the parallel state (e.g., "1" state), the resistance is low. When the magnetization is in the anti-parallel state (e.g., "0" state), the resistance is high. That is, the tunnel magneto-resistance (TMR) effect is obtained. The "1" or "0" state of the MTJ element 100 is discriminated by reading the difference in resistance value.

[2-2] Select Diode Cell

Figure 24A:
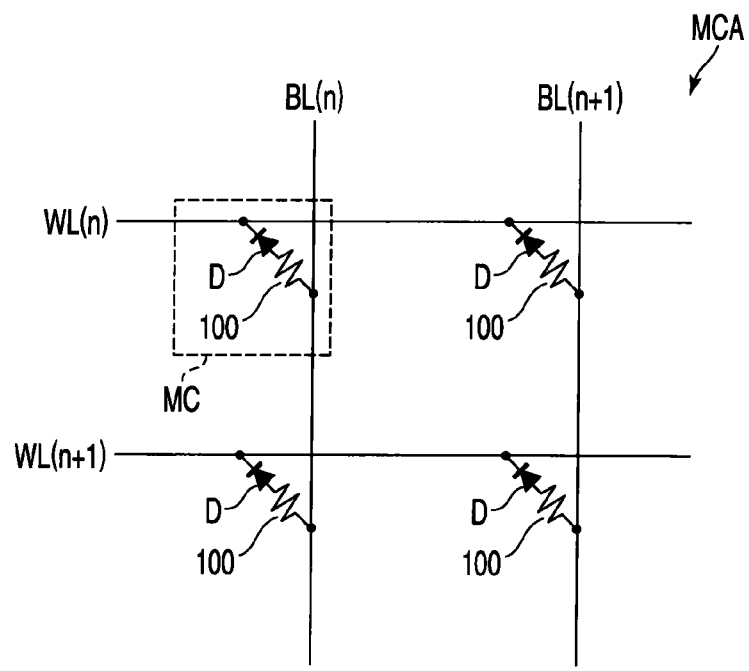
Figure 24B:
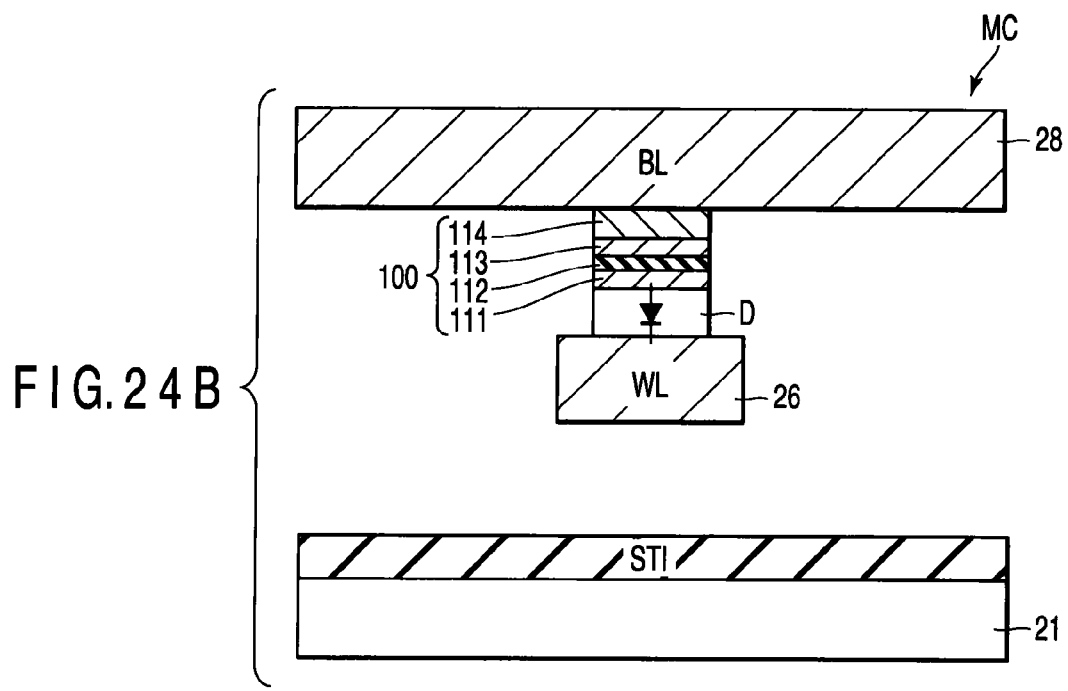

FIGS. 24A and 24B show select diode memory cells of the magnetic random access memory according to the embodiment of the present invention. The select diode cell structure will be described below.

As shown in FIGS. 24A and 24B, one cell MC having a select diode structure includes one MTJ element 100, a diode D connected to the MTJ element 100, the bit line 28, and the word line (WL) 26. The memory cell array MCA is formed by laying out a plurality of memory cells MC in an array.

The diode D is, e.g., a p-n junction diode including a p-type semiconductor layer and an n-type semiconductor layer. One terminal (e.g., p-type semiconductor layer) of the diode D is connected to the MTJ element 100. The other terminal (e.g., n-type semiconductor layer) of the diode D is connected to the word line 26. In the structure shown in FIGS. 24A and 24B, a current flows from the bit line 28 to the word line 26.

The location or direction of the diode D can be changed variously. For example, the diode D may be arranged in a direction to supply a current from the word line 26 to the bit line 28. The diode D may be formed in a semiconductor substrate 21. The diode D may have the same shape (e.g., a so-called cross shape) as the MTJ element 100.

The data write operation of the select diode memory cell is the same as that of the above-described select transistor cell. The write currents Iw1 and Iw2 are supplied to the bit line 28 and word line 26 to set the magnetization of the MTJ element 100 in the parallel or anti-parallel state.

The data read operation is also almost the same as that of the select transistor cell. In the select diode cell, the diode D is used as a read switching element. More specifically, the biases of the bit line 28 and word line 26 are controlled by using the rectifying effect of the diode D such that an unselected MTJ element 100 is reverse-biased. Accordingly, the read current Ir is supplied to only the selected MTJ element 100.

[2-3] Cross-Point Cell

Figure 25A:
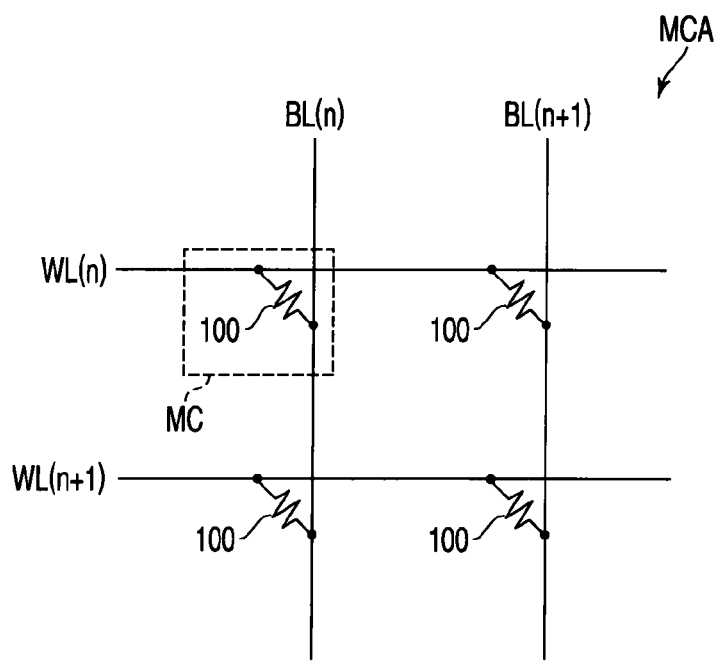
Figure 25B:
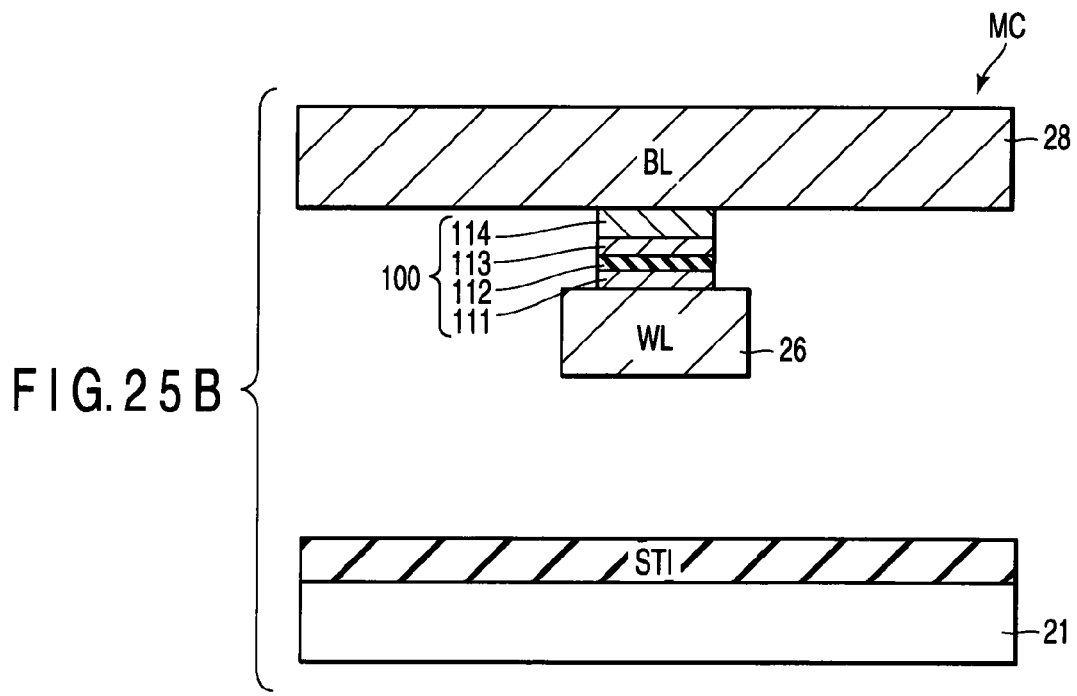

FIGS. 25A and 25B show cross-point memory cells of the magnetic random access memory according to the embodiment of the present invention. The cross-point cell structure will be described below.

As shown in FIGS. 25A and 25B, one cell MC having a cross-point structure includes one MTJ element 100, the bit line 28, and the word line 26. The memory cell array MCA is formed by laying out a plurality of memory cells MC in an array.

More specifically, the MTJ element 100 is arranged near the intersection between the bit line 28 and the word line 26. One terminal of the MTJ element 100 is connected to the word line 26. The other terminal of the MTJ element 100 is connected to the bit line 28.

The data write operation of the cross-point memory cell is the same as that of the above-described select transistor cell. The write currents Iw1 and Iw2 are supplied to the bit line 28 and word line 26 to set the magnetization of the MTJ element 100 in the parallel or anti-parallel state. In the data read operation, the read current Ir is supplied to the bit line 28 and word line 26 connected to the selected MTJ element 100, thereby reading out the data of the MTJ element 100.

[2-4] Toggle Cell

Figure 26:
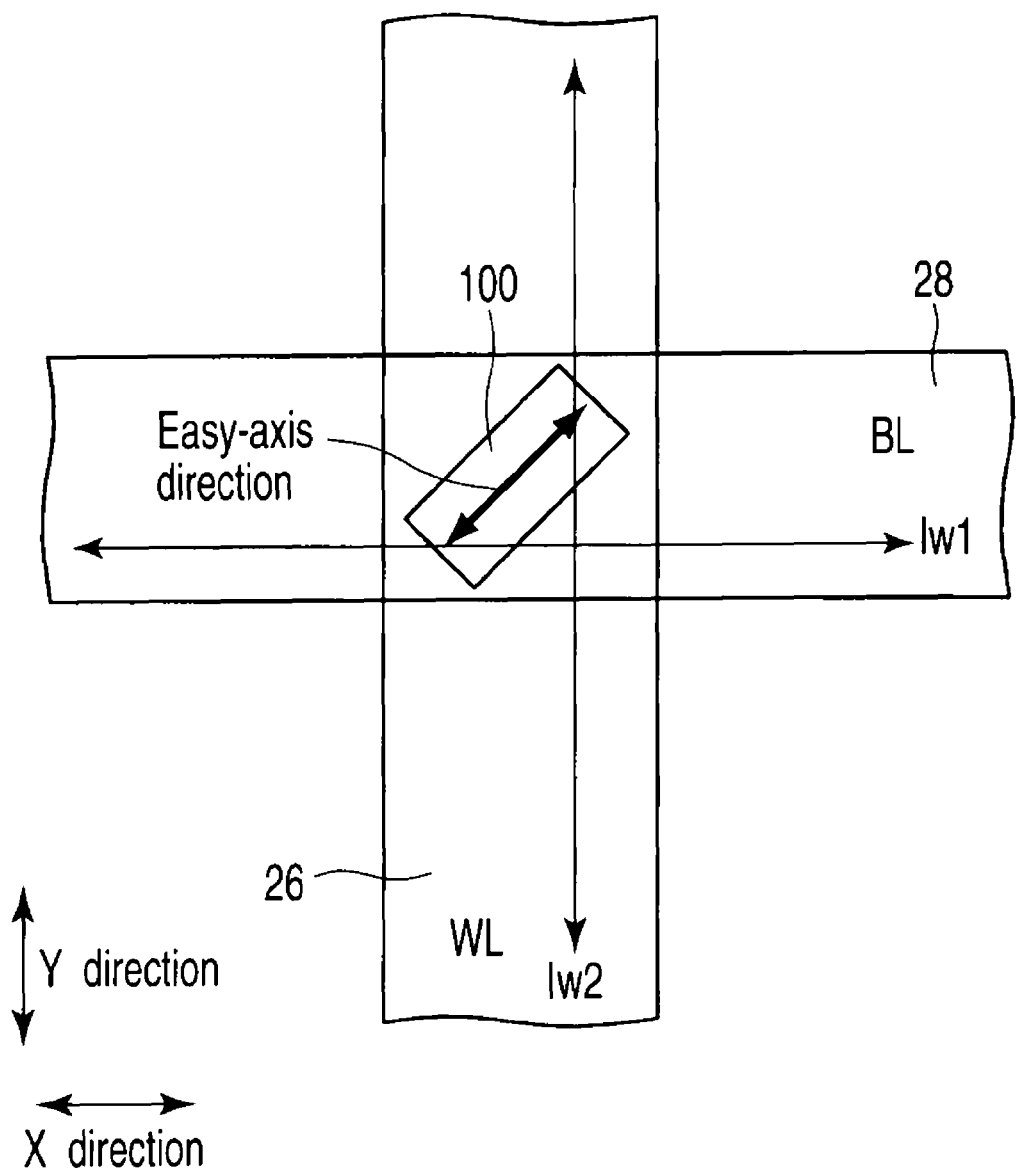
FIG. 26 is a plan view showing a toggle memory cell of a magnetic random access memory according to an embodiment of the present invention.

FIG. 26 is a plan view showing a toggle memory cell of the magnetic random access memory according to the embodiment of the present invention. The toggle cell structure will be described below.

As shown in FIG. 26, in the toggle cell, the MTJ element 100 is arranged such that the axis of easy magnetization of the MTJ element 100 is tilted with respect to the running direction (X direction) of the bit line 28 or the running direction (Y direction) of the word line 26, i.e., tilted with respect to the direction of the write current Iw1 to be supplied to the bit line 28 or the direction of the write current Iw2 supplied to the word line 26. The tilt of the MTJ element 100 is, e.g., about 30° to 60°, and preferably, about 45°. In the toggle cell, the free layer 113 of the MTJ element 100 preferably has an antiferromagnetic coupling structure containing a ferromagnetic layer/nonmagnetic layer/ferromagnetic layer.

In the above-described toggle memory cell, the data write and read are executed in the following way.

The write operation is executed in the following way. In the toggle write, before arbitrary data is written in the selected cell, the data of the selected cell is read out. If it is determined by reading out the data of the selected cell that the arbitrary data has already been written, no write is executed. If data different from the arbitrary data is written, the write is executed to rewrite the data.

After the above-described check cycle, if data must be written in the selected cell, the two write interconnections (bit line 28 and word line 26) are sequentially turned on. The write interconnection turned on first is turned off. Then, the write interconnection turned on later is turned off. For example, the procedures comprise four cycles: the word line 26 is turned on to supply the write current Iw2→ the bit line 28 is turned on to supply the write current Iw1→ the word line 26 is turned off to stop supplying the write current Iw2→ the bit line 28 is turned off to stop supplying the write current Iw1.

In the data read operation, the read current Ir is supplied to the bit line 28 and word line 26 connected to the selected MTJ element 100, thereby reading out the data of the MTJ element 100.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A magnetoresistive element comprising:
a first magnetic layer which comprises a first surface and a second surface;
a second magnetic layer;
a tunnel barrier layer which is provided between the second magnetic layer and the first surface of the first magnetic layer; and
a nonmagnetic cap layer which is a single layer, wherein the nonmagnetic cap layer contacts the second surface of the first magnetic layer and is formed of an alloy comprising a first metal material and a second metal material,
wherein
the first metal material comprises at least one element selected from the group consisting of Ti, Mn, Zn, Zr, Hf and Ta, and
the second metal material comprises at least one element selected from the group consisting of Mo, Ru, Ag, Re and Os.

2. The magnetic element according to claim 1, wherein
the first magnetic layer has a first standard electrode potential,
the nonmagnetic cap layer is formed from an alloy comprising a first metal material and a second metal material,
wherein
the first metal material has a second standard electrode potential lower than the first standard electrode potential, and
the second metal material has a third standard electrode potential higher than the first standard electrode potential.

3. The magnetic element according to claim 2, wherein a fourth standard electrode potential of the nonmagnetic cap layer is not less than −0.2 V with respect to the first standard electrode potential and is not more than +0.8 V with respect to the first standard electrode potential.

4. The element according to claim 3, wherein the fourth standard electrode potential is calculated from a weighted average of the second standard electrode potential and the third standard electrode potential.

5. A magnetic random access memory comprising the magnetoresistive element according to claim 1, a writing circuit for writing data to the magnetoresistive element, and a reading circuit for reading data from the magnetoresistive element.

* * * * *